US010741529B2

(12) United States Patent
Jung et al.

(10) Patent No.: US 10,741,529 B2
(45) **Date of Patent: *Aug. 11, 2020**

(54) SEMICONDUCTOR PACKAGES

(71) Applicant: SK hynix Inc., Icheon-si Gyeonggi-do (KR)

(72) Inventors: Won Duck Jung, Icheon-si (KR); Sung Ho Hyun, Icheon-si (KR); Ju Il Eom, Guri-si (KR)

(73) Assignee: SK hynix, Inc., Icheon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/237,292

(22) Filed: Dec. 31, 2018

(65) Prior Publication Data

US 2019/0139940 A1 May 9, 2019

Related U.S. Application Data

(63) Continuation of application No. 15/280,404, filed on Sep. 29, 2016, now Pat. No. 10,224,314.

(30) Foreign Application Priority Data

Apr. 26, 2016 (KR) ........................ 10-2016-0051153

(51) Int. Cl.
*H01L 25/07* (2006.01)
*H01L 23/535* (2006.01)
(Continued)

(52) U.S. Cl.
CPC ........ *H01L 25/071* (2013.01); *H01L 23/3128* (2013.01); *H01L 23/49816* (2013.01);
(Continued)

(58) Field of Classification Search
CPC ............ G01R 31/2834; G01R 31/2894; G11C 29/00; G11C 7/00; H01L 25/071;
(Continued)

(56) References Cited

U.S. PATENT DOCUMENTS 8,243,484 B2 * 8/2012 Kizer .................. G06F 13/4239 365/193
8,386,992 B2 2/2013 Betsui et al.
(Continued)

FOREIGN PATENT DOCUMENTS

CN 101388383 A 3/2009
KR 1020060009087 A 1/2006

*Primary Examiner* — Jarrett J Stark

(74) *Attorney, Agent, or Firm* — William Park & Associates Ltd.

(57) ABSTRACT

A planar dual die package includes a package substrate and first and second semiconductor dice disposed side by side on a first surface of the package substrate. Outer connectors are disposed on a second surface of the package substrate, and the second surface of the package substrate includes a command/address ball region and a data ball region. Each of the first and second semiconductor dice includes die pads disposed in a command/address pad region corresponding to the command/address ball region and in a data pad region corresponding to the data ball region. Each of the first and second semiconductor dice are disposed on the package substrate so that a first direction from the command/address ball region toward the data ball region coincides with a second direction from the command/address pad region toward the data pad region.

18 Claims, 23 Drawing Sheets

11

201 203 210A(210) 200A(200) 210B(210) 200B(200) 600 300 101 105 100 103 A A' 500 401A(400) 400

(51) Int. Cl.

| | |
|---|---|
| ***H01L 23/498*** | (2006.01) |
| ***H01L 23/31*** | (2006.01) |
| ***H01L 25/065*** | (2006.01) |

(52) U.S. Cl.

CPC .. *H01L 23/49822* (2013.01); *H01L 23/49827* (2013.01); *H01L 23/49838* (2013.01); *H01L 23/535* (2013.01); *H01L 25/0655* (2013.01); *H01L 25/074* (2013.01); *H01L 2224/16225* (2013.01); *H01L 2224/32145* (2013.01); *H01L 2224/32225* (2013.01); *H01L 2224/48091* (2013.01); *H01L 2224/73265* (2013.01); *H01L 2225/06513* (2013.01); *H01L 2225/06541* (2013.01); *H01L 2924/15311* (2013.01); *H01L 2924/181* (2013.01)

(58) Field of Classification Search

CPC ......... H01L 23/49838; H01L 23/49816; H01L 23/3128; H01L 23/49827; H01L 23/49822; H01L 23/535; H01L 25/074

See application file for complete search history.

(56) References Cited

U.S. PATENT DOCUMENTS

| | | | | |
|---|---|---|---|---|
| 8,421,217 | B2 | 4/2013 | Casey et al. | |
| 9,337,170 | B1 | 5/2016 | Sun et al. | |
| 9,349,707 | B1 | 5/2016 | Sun et al. | |
| 2006/0233012 | A1 | 10/2006 | Sekiguchi et al. | |
| 2008/0012107 | A1 | 1/2008 | Isa et al. | |
| 2008/0143379 | A1 | 6/2008 | Norman | |
| 2012/0278544 | A1* | 11/2012 | Eleftheriou | G06F 13/1668 711/103 |
| 2014/0167292 | A1 | 6/2014 | Masumura et al. | |
| 2014/0203457 | A1 | 7/2014 | Kim et al. | |
| 2014/0210667 | A1 | 7/2014 | Wang et al. | |
| 2014/0210668 | A1 | 7/2014 | Wang et al. | |
| 2014/0246788 | A1 | 9/2014 | Kim et al. | |
| 2014/0332966 | A1 | 11/2014 | Xiu et al. | |
| 2015/0001717 | A1 | 1/2015 | Karhade et al. | |
| 2016/0012865 | A1 | 1/2016 | Lee et al. | |
| 2016/0181214 | A1 | 6/2016 | Oh et al. | |
| 2016/0190096 | A1 | 6/2016 | Yu et al. | |
| 2016/0240497 | A1* | 8/2016 | Chen | H01L 25/0655 |
| 2016/0359230 | A1 | 12/2016 | Wang et al. | |
| 2017/0033080 | A1 | 2/2017 | Chen et al. | |

* cited by examiner 11
600
300
101
100
105
103
A'
A
200B(200)
210B(210)
200A(200)
210A(210)
203
201
400
500
401A(400)

13
2600
2200D
2200B
2200A
2200C
2550
2500
2300
2301
2303
2160
2170
2180
2190
2140
2162
2110
2120
2130
2150
2104
2100
2172
2182
2400

SEMICONDUCTOR PACKAGES

CROSS-REFERENCE TO RELATED APPLICATIONS

The present application is a continuation of U.S. application Ser. No. 15/280,404, filed on Sep. 29, 2016. The present application claims priority under 35 U.S.C. 119(a) to Korean Patent Application No. 10-2016-0051153 filed on Apr. 26, 2016, which is herein incorporated by reference in its entirety.

BACKGROUND

1. Technical Field

Embodiments of the present disclosure relate to semiconductor packages and, more particularly, to semiconductor packages having a planar dual die package (P-DDP) structure.

2. Related Art

Semiconductor memory devices such as semiconductor memory packages employed in an electronic product or an electronic system may be arrayed to constitute a memory module and may be electrically connected to a system board. For example, a plurality of memory packages may be mounted on a module board to constitute the memory module such as a dual in-line memory module (DIMM). As electronic systems have demanded larger capacity for memory, a lot of effort has focused on developing high density memory modules.

In order to fabricate high density memory modules, a plurality of semiconductor memory chips (or dice) may be encapsulated in a single package to provide a multi-chip package, and a plurality of multi-chip packages may be employed in a memory module. In order to increase memory capacity of each semiconductor package, a plurality of memory dice may be stacked to provide a dual die package (DDP).

As electronic systems are developed to operate at high speed, signal integrity (SI) has become a critical issue. Since each high density memory module employs a plurality of semiconductor memory packages to increase data storage capacity, it may be very important to guarantee excellent signal integrity of the memory packages for high speed operation of the electronic systems.

SUMMARY

According to an embodiment, a planar dual die package includes a package substrate having a first surface and a second surface which are opposite to each other. A first semiconductor die and a second semiconductor die are disposed side by side on the first surface of the package substrate in a lateral direction. The package substrate includes outer connectors disposed in a command/address ball region of the second surface and in a data ball region of the second surface, and each of the first and second semiconductor dice includes die pads disposed in a command/address pad region corresponding to the command/address ball region and in a data pad region corresponding to the data ball region. Each of the first and second semiconductor dice is disposed on the package substrate so that a first direction from the command/address ball region toward the data ball region coincides with a second direction from the command/address pad region toward the data pad region. The package substrate further includes signal paths that electrically connect the outer connectors to the die pads of the first semiconductor die and the die pads of the second semiconductor die.

According to another embodiment, a planar dual die package includes a package substrate having a first surface and a second surface which are opposite to each other. A first semiconductor die and a second semiconductor die are disposed side by side on the first surface of the package substrate in a lateral direction. Each of the first and second semiconductor dice has die pads. The package substrate includes outer connectors disposed on the second surface and signal paths electrically connecting the outer connectors to the die pads of the first semiconductor die and the die pads of the second semiconductor die.

According to another embodiment, a planar dual die package includes a package substrate having a first surface and a second surface which are opposite to each other. A first semiconductor die and a second semiconductor die that are disposed side by side on the first surface of the package substrate in a lateral direction. The first semiconductor die includes a first die pad and the second semiconductor die includes a second die pad. The first semiconductor die includes a third die pad and the second semiconductor die includes a fourth die pad. The package substrate includes a first outer connector and a second outer connector disposed on the second surface, a first signal path electrically connecting the first die pad to the first outer connector, a second signal path electrically connecting the second die pad to the first outer connector, a third signal path electrically connecting the third die pad to the second outer connector, and a fourth signal path electrically connecting the fourth die pad to the second outer connector. Each of the first to fourth signal paths include trace patterns located at two or more different levels.

According to another embodiment, a semiconductor package includes a package substrate having a first surface and a second surface which are opposite to each other, a first semiconductor die and a second semiconductor die disposed side by side on the first surface of the package substrate in a lateral direction, a third semiconductor die stacked on the first semiconductor die, a fourth semiconductor die stacked on the second semiconductor die, first through electrodes and first inter-die connectors electrically connecting the first semiconductor die to the third semiconductor die, second through electrodes and second inter-die connectors electrically connecting the second semiconductor die to the fourth semiconductor die, and outer connectors disposed on trace patterns of the package substrate. Each of the first and second semiconductor dice includes die pads, and the second surface of the package substrate includes a command/address ball region and a data ball region. Each of the first and second semiconductor dice includes a command/address pad region corresponding to the command/address ball region and a data pad region corresponding to the data ball region. Each of the first and second semiconductor dice are disposed on the package substrate so that a first direction from the command/address ball region toward the data ball region coincides with a second direction from the command/address pad region toward the data pad region. The package substrate further includes signal paths that electrically connect one of the outer connectors to both of any one of the die pads of the first semiconductor die and any one of the die pads of the second semiconductor die.

According to another embodiment, a semiconductor package includes a package substrate having a first surface and a second surface which are opposite to each other, a first semiconductor die and a second semiconductor die disposed side by side on the first surface of the package substrate in a lateral direction, a third semiconductor die stacked on the first semiconductor die, a fourth semiconductor die stacked on the second semiconductor die, first through electrodes and first inter-die connectors electrically connecting the first semiconductor die to the third semiconductor die, second through electrodes and second inter-die connectors electrically connecting the second semiconductor die to the fourth semiconductor die, and outer connectors disposed on the second surface of the package substrate. Each of the first and second semiconductor dice includes die pads, and the package substrate includes signal paths that electrically connect one of the outer connectors to both of any one of the die pads of the first semiconductor die and any one of the die pads of the second semiconductor die.

According to another embodiment, there is provided a memory card including a package. The package includes a package substrate having a first surface and a second surface which are opposite to each other. A first semiconductor die and a second semiconductor die are disposed side by side on the first surface of the package substrate in a lateral direction. The package substrate includes outer connectors disposed in a command/address ball region of the second surface and in a data ball region of the second surface, and each of the first and second semiconductor dice includes die pads disposed in a command/address pad region corresponding to the command/address ball region and in a data pad region corresponding to the data ball region. Each of the first and second semiconductor dice are disposed on the package substrate so that a first direction from the command/address ball region toward the data ball region coincides with a second direction from the command/address pad region toward the data pad region. The package substrate further includes signal paths that electrically connect the outer connectors to the die pads of the first semiconductor die and the die pads of the second semiconductor die.

According to another embodiment, there is provided a memory card including a package. The package includes a package substrate having a first surface and a second surface which are opposite to each other. A first semiconductor die and a second semiconductor die are disposed side by side on the first surface of the package substrate in a lateral direction. Each of the first and second semiconductor dice has die pads. The package substrate includes outer connectors disposed on the second surface and signal paths electrically connecting the outer connectors to the die pads of the first semiconductor die and the die pads of the second semiconductor die.

According to another embodiment, there is provided a memory card including a package. The package includes a package substrate having a first surface and a second surface which are opposite to each other. A first semiconductor die and a second semiconductor die are disposed side by side on the first surface of the package substrate in a lateral direction. The first semiconductor die includes a first die pad and the second semiconductor die includes a second die pad. The first semiconductor die includes a third die pad and the second semiconductor die includes a fourth die pad. The package substrate includes a first outer connector and a second outer connector disposed on the second surface, a first signal path electrically connecting the first die pad to the first outer connector, a second signal path electrically connecting the second die pad to the first outer connector, a third signal path electrically connecting the third die pad to the second outer connector, and a fourth signal path electrically connecting the fourth die pad to the second outer connector. Each of the first to fourth signal paths includes trace patterns located at two or more different levels.

According to another embodiment, there is provided a memory card including a package. The package includes a package substrate having a first surface and a second surface which are opposite to each other, a first semiconductor die and a second semiconductor die disposed side by side on the first surface of the package substrate in a lateral direction, a third semiconductor die stacked on the first semiconductor die, a fourth semiconductor die stacked on the second semiconductor die, first through electrodes and first inter-die connectors electrically connecting the first semiconductor die to the third semiconductor die, second through electrodes and second inter-die connectors electrically connecting the second semiconductor die to the fourth semiconductor die, and outer connectors disposed on trace patterns of the package substrate. Each of the first and second semiconductor dice includes die pads, and the second surface of the package substrate includes a command/address ball region and a data ball region. Each of the first and second semiconductor dice includes a command/address pad region corresponding to the command/address ball region and a data pad region corresponding to the data ball region. Each of the first and second semiconductor dice are disposed on the package substrate so that a first direction from the command/address ball region toward the data ball region coincides with a second direction from the command/address pad region toward the data pad region. The package substrate further includes signal paths that electrically connect one of the outer connectors to both of any one of the die pads of the first semiconductor die and any one of the die pads of the second semiconductor die.

According to another embodiment, there is provided a memory card including a package. The package includes a package substrate having a first surface and a second surface which are opposite to each other, a first semiconductor die and a second semiconductor die disposed side by side on the first surface of the package substrate in a lateral direction, a third semiconductor die stacked on the first semiconductor die, a fourth semiconductor die stacked on the second semiconductor die, first through electrodes and first inter-die connectors electrically connecting the first semiconductor die to the third semiconductor die, second through electrodes and second inter-die connectors electrically connecting the second semiconductor die to the fourth semiconductor die, and outer connectors disposed on trace patterns of the package substrate. Each of the first and second semiconductor dice includes die pads, and the package substrate includes signal paths that electrically connect one of the outer connectors to both of any one of the die pads of the first semiconductor die and any one of the die pads of the second semiconductor die.

According to another embodiment, there is provided an electronic system including a package. The package includes a package substrate having a first surface and a second surface which are opposite to each other. A first semiconductor die and a second semiconductor die are disposed side by side on the first surface of the package substrate in a lateral direction. The package substrate includes outer connectors disposed in a command/address ball region of the second surface and in a data ball region of the second surface, and each of the first and second semiconductor dice includes die pads disposed in a command/address pad region corresponding to the command/address ball region and in a data pad region corresponding to the data ball region. Each of the first and second semiconductor dice are disposed on the package substrate so that a first direction from the command/address ball region toward the data ball region coincides with a second direction from the command/address pad region toward the data pad region. The package substrate further includes signal paths that electrically connect the outer connectors to the die pads of the first semiconductor die and the die pads of the second semiconductor die.

According to another embodiment, there is provided an electronic system including a package. The package includes a package substrate having a first surface and a second surface which are opposite to each other. A first semiconductor die and a second semiconductor die are disposed side by side on the first surface of the package substrate in a lateral direction. Each of the first and second semiconductor dice has die pads. The package substrate includes outer connectors disposed on the second surface and signal paths electrically connecting the outer connectors to the die pads of the first semiconductor die and the die pads of the second semiconductor die.

According to another embodiment, there is provided an electronic system including a package. The package includes a package substrate having a first surface and a second surface which are opposite to each other. A first semiconductor die and a second semiconductor die are disposed side by side on the first surface of the package substrate in a lateral direction. The first semiconductor die includes a first die pad and the second semiconductor die includes a second die pad. The first semiconductor die includes a third die pad and the second semiconductor die includes a fourth die pad. The package substrate includes a first outer connector and a second outer connector disposed on the second surface, a first signal path electrically connecting the first die pad to the first outer connector, a second signal path electrically connecting the second die pad to the first outer connector, a third signal path electrically connecting the third die pad to the second outer connector, and a fourth signal path electrically connecting the fourth die pad to the second outer connector. Each of the first to fourth signal paths includes trace patterns located at two or more different levels.

According to another embodiment, there is provided an electronic system including a package. The package includes a package substrate having a first surface and a second surface which are opposite to each other, a first semiconductor die and a second semiconductor die disposed side by side on the first surface of the package substrate in a lateral direction, a third semiconductor die stacked on the first semiconductor die, a fourth semiconductor die stacked on the second semiconductor die, first through electrodes and first inter-die connectors electrically connecting the first semiconductor die to the third semiconductor die, second through electrodes and second inter-die connectors electrically connecting the second semiconductor die to the fourth semiconductor die, and outer connectors disposed on trace patterns of the package substrate. Each of the first and second semiconductor dice includes die pads, and the second surface of the package substrate includes a command/address ball region and a data ball region. Each of the first and second semiconductor dice includes a command/address pad region corresponding to the command/address ball region and a data pad region corresponding to the data ball region. Each of the first and second semiconductor dice are disposed on the package substrate so that a first direction from the command/address ball region toward the data ball region coincides with a second direction from the command/address pad region toward the data pad region. The package substrate further includes signal paths that electrically connect one of the outer connectors to both of any one of the die pads of the first semiconductor die and any one of the die pads of the second semiconductor die.

According to another embodiment, there is provided an electronic system including a package. The package includes a package substrate having a first surface and a second surface which are opposite to each other, a first semiconductor die and a second semiconductor die disposed side by side on the first surface of the package substrate in a lateral direction, a third semiconductor die stacked on the first semiconductor die, a fourth semiconductor die stacked on the second semiconductor die, first through electrodes and first inter-die connectors electrically connecting the first semiconductor die to the third semiconductor die, second through electrodes and second inter-die connectors electrically connecting the second semiconductor die to the fourth semiconductor die, and outer connectors disposed on trace patterns of the package substrate. Each of the first and second semiconductor dice includes die pads, and the package substrate includes signal paths that electrically connect one of the outer connectors to both of any one of the die pads of the first semiconductor die and any one of the die pads of the second semiconductor die.

DETAILED DESCRIPTION OF THE EMBODIMENTS

Figure 1:
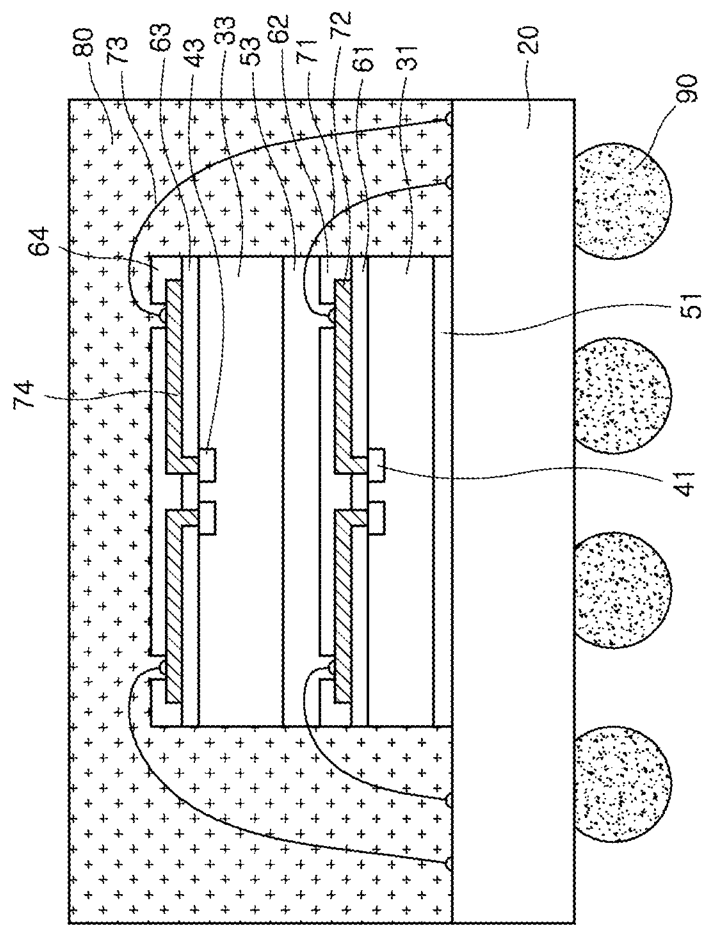
FIG. 1 is a cross-sectional view illustrating a general dual die package.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms)

used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure.

A semiconductor package may include electronic devices such as semiconductor chips or semiconductor dice. The semiconductor chips or the semiconductor dice may be obtained by separating a semiconductor substrate such as a wafer into a plurality of pieces using a die sawing process. The semiconductor chips or the semiconductor dice may correspond to memory dice including dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Thus, even though a reference numeral is not mentioned or described with reference to a drawing, the reference numeral may be mentioned or described with reference to another drawing. In addition, even though a reference numeral is not shown in a drawing, it may be mentioned or described with reference to another drawing.

A semiconductor memory module, for example, a dual in-line memory module (DIMM) may be configured to include packages of buffer devices and a plurality of semiconductor memory packages in order to provide a large capacity of memory. The semiconductor memory packages may be used to store data therein, and the buffer devices may be used to solve a bottleneck phenomenon that occurs when data are transmitted between the semiconductor memory packages and an external system. The buffer devices may include register clock drivers (RCDs) for controlling command/address (CA) signals and data buffers for controlling input/output (I/O) signals. In each memory module, a single RCD may be configured to control several tens of memory dice. Thus, a signal integrity characteristic in command/address channels may be degraded. Degradation of the signal integrity characteristic may be due to capacitive components in each memory package. Since the signals are delayed due to the capacitive components, it may be necessary to reduce capacitance values of the capacitive components in order to improve the signal integrity characteristic.

FIG. 1 is a cross-sectional view illustrating a general dual die package 10. Referring to FIG. 1, the general dual die package 10 may be configured to include a first memory die 31 and a second memory die 33 which are vertically stacked on a package substrate 20. The first memory die 31 may be attached to the package substrate 20 using a first adhesive layer 51, and the second memory die 33 may be attached onto the first memory die 31 using a second adhesive layer 53. The first memory die 31 may be electrically connected to the package substrate 20 through first bonding wires 71, and the second memory die 33 may be electrically connected to the package substrate 20 through second bonding wires 73. The first and second memory dice 31 and 33 may be covered with a sealant 80.

The first memory die 31 may include first die pads 41 that are disposed on a surface thereof. The first die pads 41 may be electrically connected to first redistribution lines 72, each of which extends onto an edge of the first memory die 31. The first redistribution lines 72 may be disposed between a first dielectric layer 61 and a second dielectric layer 62. The first bonding wires 71 may be combined with portions of the first redistribution lines 72, respectively. The second memory die 33 may include second die pads 43 that are disposed on a surface thereof. The second die pads 43 may be electrically connected to second redistribution lines 74, each of which extends onto an edge of the second memory die 33. The second redistribution lines 74 may be disposed between a third dielectric layer 63 and a fourth dielectric layer 64. The second bonding wires 73 may be combined with portions of the second redistribution lines 73, respectively. Connection balls 90 may be attached onto a surface of the package substrate 20 opposite to the first and second memory dice 31 and 33.

The general dual die package 10 may have signal paths that are comprised of the bonding wires 71 and 73 connected to the package substrate 20 and the redistribution lines 72 and 74 connected to the bonding wires 71 and 73. In the general dual die package 10, presence of the redistribution lines 72 and 74 may lead to an increase in parasitic capacitance of the signal paths. This increase in parasitic capacitance of the signal paths may cause degradation of the signal integrity of the general dual die package 10.

Figure 2:
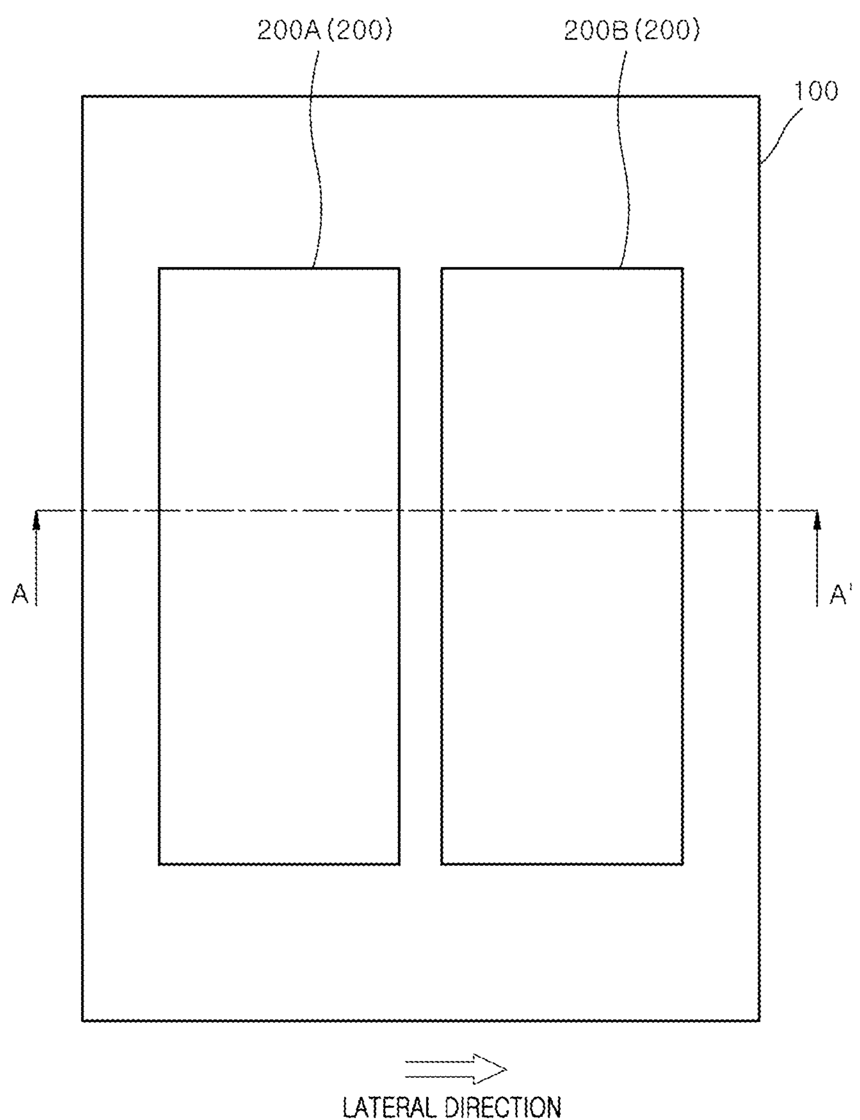
FIGS. 2 and 3 illustrate a planar dual die package according to an embodiment.
Figure 3:
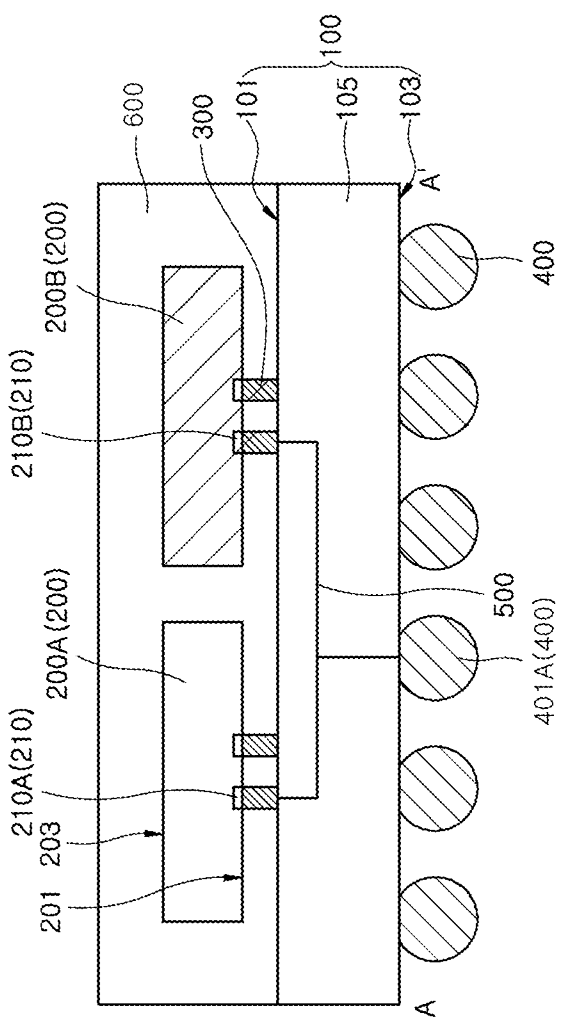

FIG. 2 is a plan view illustrating a planar dual die package (P-DDP) 11 according to an embodiment, and FIG. 3 is a cross-sectional view taken along a line A-A' of FIG. 2. As illustrated in FIG. 2, the P-DDP 11 may be configured to include a plurality of semiconductor dice 200 disposed on a package substrate 100. The semiconductor dice 200 may be memory devices such as DRAM devices. The semiconductor dice 200 may be disposed side by side on the package substrate 100 in a lateral direction. A first semiconductor die 200A corresponding to a left die of the semiconductor dice 200 may have the same configuration and function as a second semiconductor die 200B corresponding to a right die of the semiconductor dice 200. Since the first and second semiconductor dice 200A and 200B are not vertically stacked, each of the first and second semiconductor dice 200A and 200B may optionally not include any redistribution lines. Accordingly, no parasitic capacitance due to redistribution lines may exist. That is, a total capacitance value of signal paths may be reduced to improve a signal integrity characteristic of the P-DDP 11 as compared with the general dual die package 10 shown in FIG. 1.

As illustrated in FIG. 3, each of the semiconductor dice 200 may be mounted on a first surface 101 of a body 105 of the package substrate 100 in a flip chip form. The semiconductor dice 200 may be mounted on the package substrate 100 so that a third surface 201 of each of the semiconductor dice 200 faces the first surface 101 of the body 105 of the package substrate 100, and a fourth surface 203 of each of the semiconductor dice 200 is located at an opposite side to the package substrate 100. Die pads 210 may be disposed on the third surface 201 of each of the semiconductor dice 200.

First and second semiconductor dice 200A and 200B may be disposed on the package substrate 100 so that the die pads 210 face the first surface 101 of the package substrate 100. Inner connectors 300 may be disposed between the package substrate 100 and each of the semiconductor dice 200 to electrically connect the first surface 101 of the package substrate 100 to the die pads 210 of each semiconductor die 200. Each of the inner connectors 300 may have a bump shape. Outer connectors 400 such as solder balls may be disposed on a second surface 103 of the body 105 opposite to the first surface 101 of the body 105 and the semiconductor dice 200. The outer connectors 400 may electrically connect the P-DDP 11 to an external system or an external device, for example, a module board. The first surface 101 of the body 105 of the package substrate 100 and the semiconductor dice 200 may be covered with a sealant 600. The sealant 600 may be a molding layer comprised of an epoxy molding compound (EMC) material.

Signal paths 500 may be disposed in the package substrate 100. Each of the signal paths 500 may be electrically connected to both the first and second semiconductor dice 200A and 200B. For example, a specific outer connector 401A among the outer connectors 400 may be electrically connected to one die pad 210A of the first semiconductor die 200A as well as one die pad 210B of the second semiconductor die 200B through any one of the signal paths 500.

The die pad 210A and the die pad 210B connected to each other by the signal path 500 may be the same kind of signal pins. For example, if the die pad 210A is a first address pin of the first semiconductor die 200A, the die pad 210B electrically connected to the die pad 210A may also be a first address pin of the second semiconductor die 200B. Since the first and second semiconductor dice 200A and 200B have substantially the same function, the same signal may be applied to or outputted from the first and second semiconductor dice 200A and 200B through the signal path 500. Because at least one of the outer connectors 400 is electrically connected to both the first semiconductor die 200A and the second semiconductor die 200B through any one of the signal paths 500, a signal applied to any one of the outer connectors 400 may be simultaneously transmitted to both of the first and second semiconductor dice 200A and 200B through any one of the signal paths 500 or vice versa. The first and second semiconductor dice 200A and 200B may be disposed side by side in the lateral direction and may also be configured to provide a dual die package structure.

Figure 4:
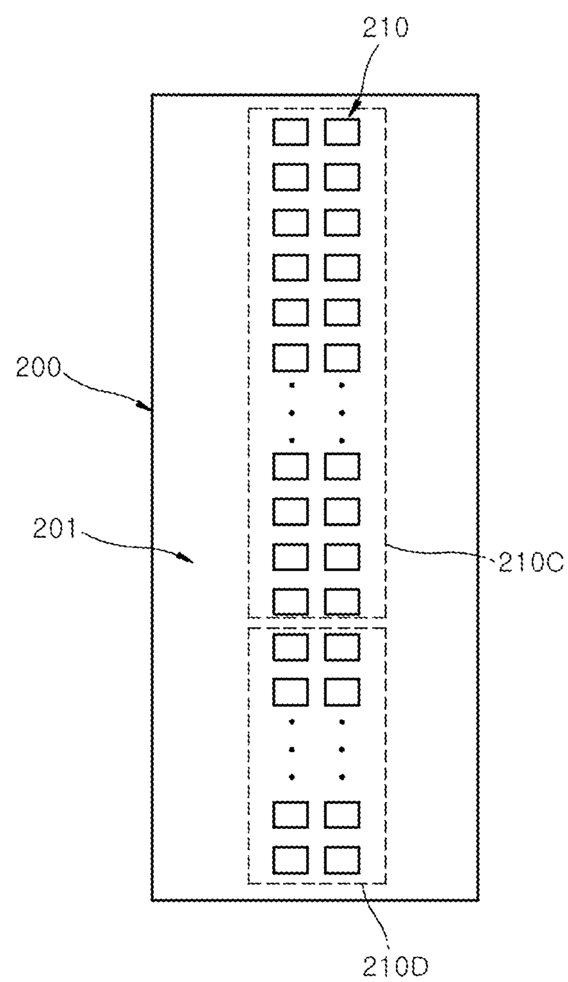
FIGS. 4, 5, and 6 illustrate a semiconductor die of a planar dual die package according to an embodiment.
Figure 5:
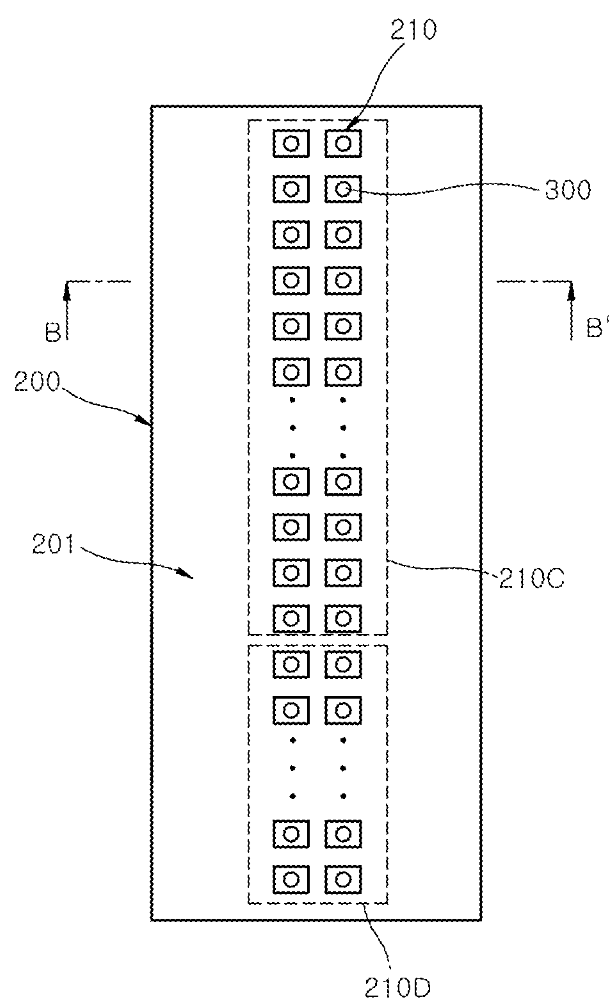
Figure 6:
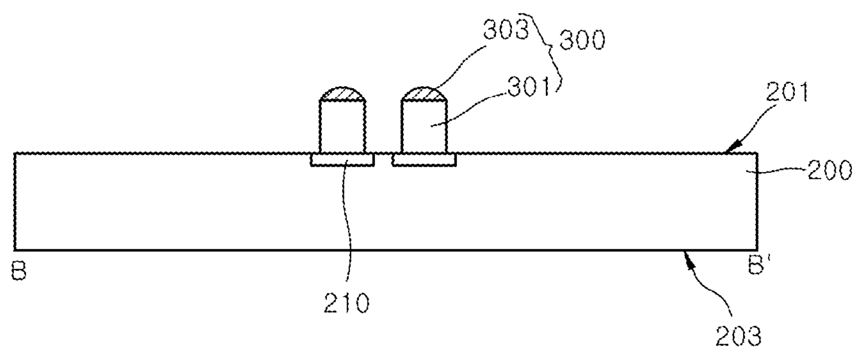

FIGS. 4, 5 and 6 illustrate an array of the die pads 210 of the semiconductor die 200 of the P-DDP 11 shown in FIGS. 2 and 3. FIG. 6 is a cross-sectional view taken along a line B-B' of FIG. 5.

As illustrated in FIG. 4, the die pads 210 may be arrayed on the third surface 201 of the semiconductor die 200. The die pads 210 may be arrayed on a central portion of the third surface 201 of the semiconductor die 200 to provide a center pad array. The die pads 210 may be arrayed in two columns. The die pads 210 may be classified into two groups. That is, some of the die pads 210 may be disposed in a first region corresponding to a command/address pad region 210C, and the others of the die pads 210 may be disposed in a second region corresponding to a data pad region 210D.

The die pads 210 disposed in the command/address pad region 210C may receive a command signal for controlling operations of the semiconductor die 200 as well as an address signal for selecting at least one among a plurality of memory cells included in the semiconductor die 200. External data may be inputted to the semiconductor die 200 through the die pads 210 disposed in the data pad region 210D and the data may be stored in memory cells of the semiconductor die 200, or the data stored in the memory cells of the semiconductor die 200 may be outputted through the die pads 210 disposed in the data pad region 210D. The die pads 210 disposed in the command/address pad region 210C may be connected to various signal pins. For example, the signal pins connected to die pads 210 in the command/address pad region 210C may include address pins A0~A17, a column address strobe (CAS_N) pin, a chip selection (CS_N) pin, a row address strobe (RAS_N) pin, a clock enable (CKE) pin, a CKE1 pin, a reset (RESET_N) pin, and an alert (ALERT_N) pin. In addition, signal pins connected to die pads 210 in the data pad region 210D may include at least one data pin, for example, a plurality of data pins DQ0~DQ7. The command/address pad region 210C may be disposed adjacent to the data pad region 210D for design efficiency.

As illustrated in FIGS. 5 and 6, the inner connectors 300 may be respectively combined with the die pads 210 of the semiconductor die 200 to electrically connect the die pads 210 to the package substrate (100 of FIG. 3). Each of the inner connectors 300 may include a conductive post 301 such as a copper post and a solder layer 303 formed on an end of the conductive post 301. The inner connectors 300 may be formed to have bump shapes and to electrically connect the semiconductor die 200 having a flip chip form to the package substrate (100 of FIG. 3). Alternatively, the die pads 210 of the semiconductor die 200 may be electrically connected to the package substrate 100 through bonding wires (not shown) without using the inner connectors 300.

Figure 7:
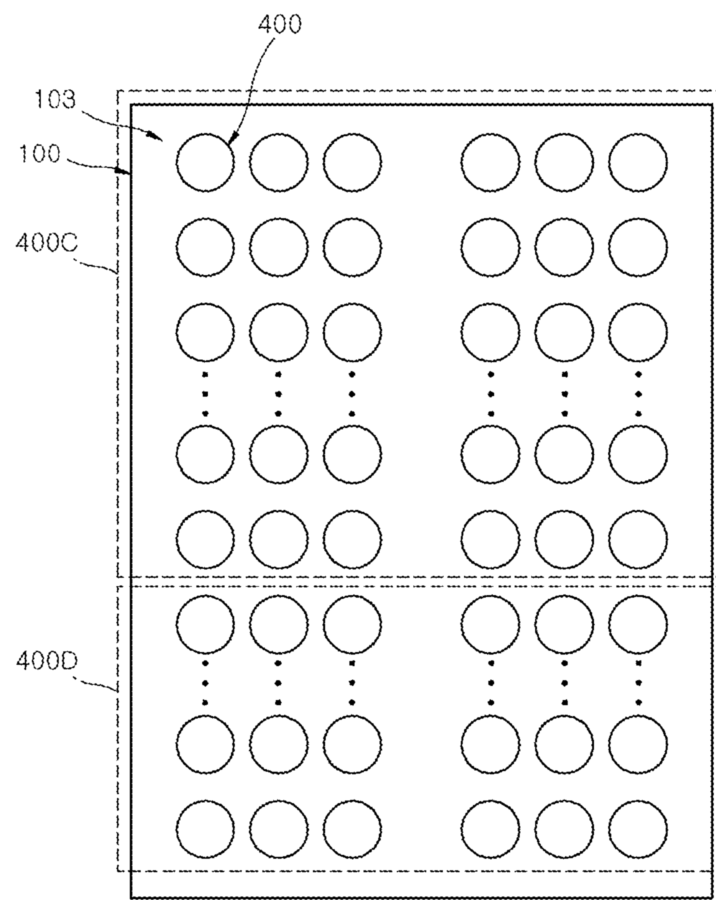
FIG. 7 is a ball map illustrating a planar array of outer connectors of a planar dual die package according to an embodiment.

FIG. 7 is a ball map illustrating an array of the outer connectors 400 of the P-DDP 11 shown in FIG. 3. Referring to FIGS. 3 and 7, the outer connectors 400 may be arrayed on the second surface 103 of the package substrate 100 opposite to the first surface 101 over which the semiconductor dice 200 may reside. The outer connectors 400 may act as electrodes for electrically connecting the P-DDP 11 to an external device or the like. The outer connectors 400 may be disposed in a ball grid array (BGA) form or a land grid array (LGA) form according to the embodiments. FIG. 7 corresponds to a ball map of the outer connectors 400 which are arrayed in a BGA form.

The outer connectors 400 may be classified into two groups. That is, some of the outer connectors 400 may be disposed in a third region corresponding to a command/address ball region 400C, and the others of the outer connectors 400 may be disposed in a second region corresponding to a data ball region 400D. The command/address ball region 400C and the data ball region 400D may be defined as two distinct regions of the second surface 103 of the package substrate 100. The outer connectors 400 disposed in the command/address ball region 400C may receive a command signal for controlling operations of the semiconductor die 200 as well as an address signal for selecting at least one among a plurality of memory cells included in the semiconductor die 200. External data may be inputted to the semiconductor die 200 through the outer connectors 400 disposed in the data ball region 400D and may be stored in memory cells of the semiconductor die 200, or the data stored in memory cells of the semiconductor die 200 may be outputted through the outer connectors 400 disposed in the data ball region 400D. The outer connectors 400 disposed in the command/address ball region 400C may correspond to various signal pins including the address pins A0~A17, the column address strobe (CAS_N) pin, the chip selection (CS_N) pin, the row address strobe (RAS_N) pin, the CKE pin, the CKE1 pin, the reset (RESET_N) pin, and the alert (ALERT_N) pin. In addition, the outer connectors 400 disposed in the data ball region 400D may correspond to data pins, for example, the plurality of data pins DQ0~DQ7. The command/address ball region 400C may be disposed adjacent to the data ball region 400D for design efficiency.

Figure 8:
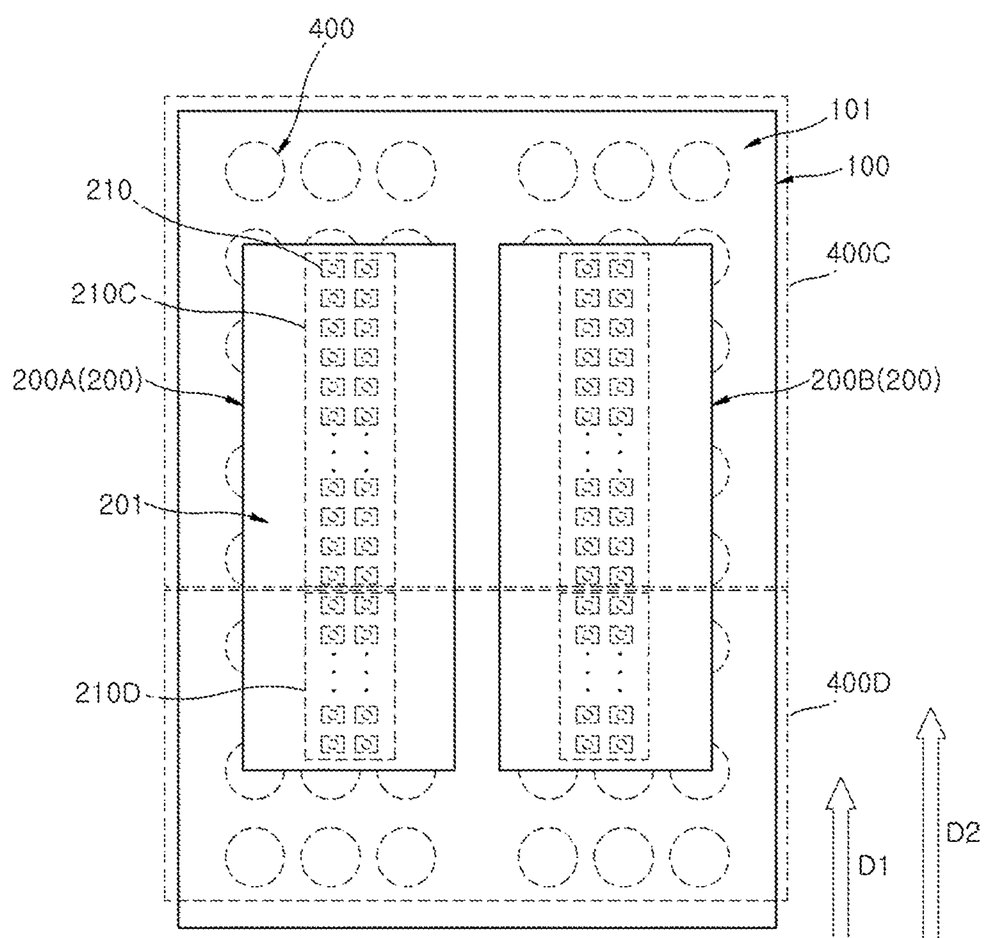
FIGS. 8 to 11 are plan views illustrating disposition of semiconductor dice of planar dual die packages according to some embodiments.
Figure 9:
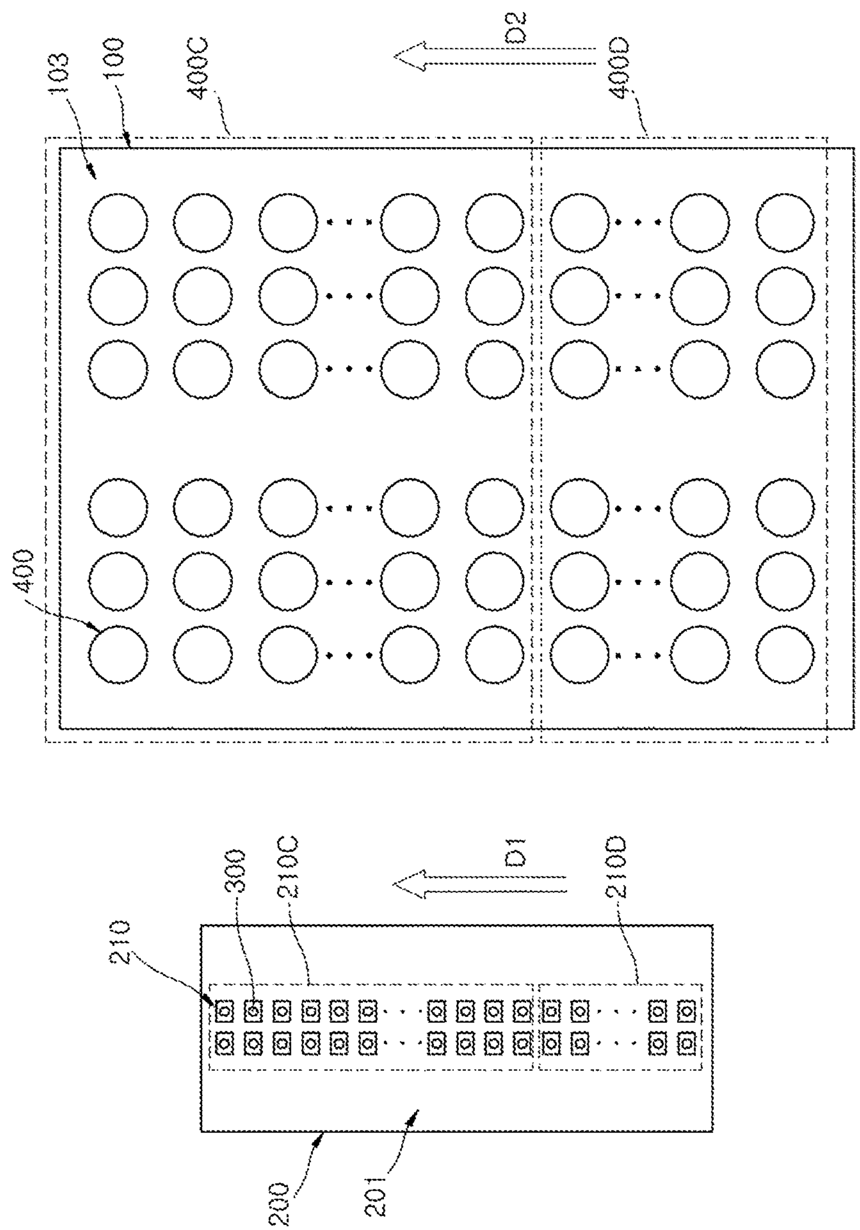

FIGS. 8 and 9 are plan views illustrating the semiconductor dice 200 and the outer connectors 400 of the P-DDP 11 shown in FIG. 3. FIG. 8 is a plan view illustrating the semiconductor dice 200 disposed on the first surface 101 of the package substrate 100, and FIG. 9 is a plan view illustrating the outer connectors 400 disposed on the package substrate 100 together with the die pads 210 of the semiconductor die 200.

As illustrated in FIG. 8, the first and second semiconductor dice 200A and 200B may be mounted side by side on the package substrate 100 so that the die pads 210 of the first and second semiconductor dice 200A and 200B are arrayed in the same direction. As illustrated in FIG. 9, the die pads 210 of each semiconductor die 200 may be arrayed in a direction D1, and the command/address pad region 210C and the data pad region 210D may be defined to be adjacent to each other in the direction D1. In each of the command/address pad region 210C and the data pad region 210D, the die pads 210 may be arrayed in two columns. The command/address ball region 400C and the data ball region 400D may be defined to be adjacent to each other in a direction D2 parallel with the direction D1. In each of the command/address ball region 400C and the data ball region 400D, the outer connectors 400 may be arrayed in the direction D2.

The semiconductor dice 200 may be disposed on the package substrate 100 so that the direction D1 coincides or is parallel with the direction D2, as illustrated in FIG. 8. The semiconductor dice 200 may be disposed on the package substrate 100 so that the data pad regions 210D of the semiconductor dice 200 are close to and may be disposed over the data ball region 400D rather than the command/address ball region 400C. The semiconductor dice 200 may be disposed on the package substrate 100 so that the command/address pad regions 210C of the semiconductor dice 200 are close to the command/address ball region 400C rather than the data ball region 400D. As such, the direction D1 along which the die pads 210 are arrayed may be parallel with the direction D2 along which the outer connectors 400 are arrayed.

Lengths of the signal paths from the die pads 210 to the outer connectors 400 may vary according to positions of the semiconductor dice 200 disposed on the package substrate 100. In the event that the semiconductor dice 200 are disposed on the package substrate 100 so that the direction D1 along which the die pads 210 are arrayed coincides with the direction D2 along which the outer connectors 400 are arrayed, the lengths of the signal paths may be minimized.

A total capacitance value affecting a signal integrity of the P-DDP (11 of FIGS. 2 and 3) may include a capacitance value Cdie due to the semiconductor dice 200 mounted on the package substrate 100 and a capacitance value Cpackagesubstrate due to the package substrate 100. If lengths of interconnections or trace patterns included in the package substrate 100 increase, the capacitance value Cpackagesubstrate due to the package substrate 100 may also increase. Thus, the capacitance value Cpackagesubstrate due to the package substrate 100 may be reduced by adjusting the position of the semiconductor dice 200 mounted on the package substrate 100 to decrease the length of the interconnections or the trace patterns from the die pads 210 to the outer connectors 400 included in the package substrate 100. If the capacitance value Cpackagesubstrate due to the package substrate 100 is reduced, a signal integrity of a semiconductor module employing the P-DDP 11 may be improved.

Figure 10:
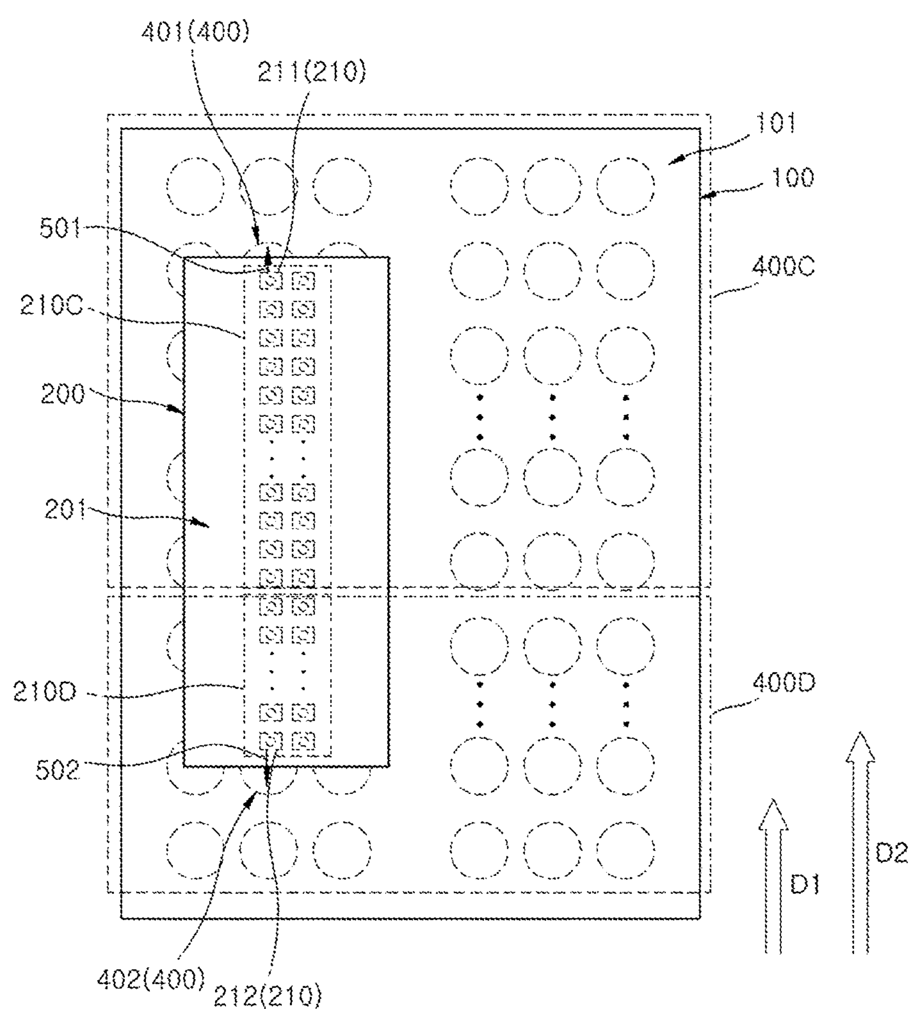
Figure 11:
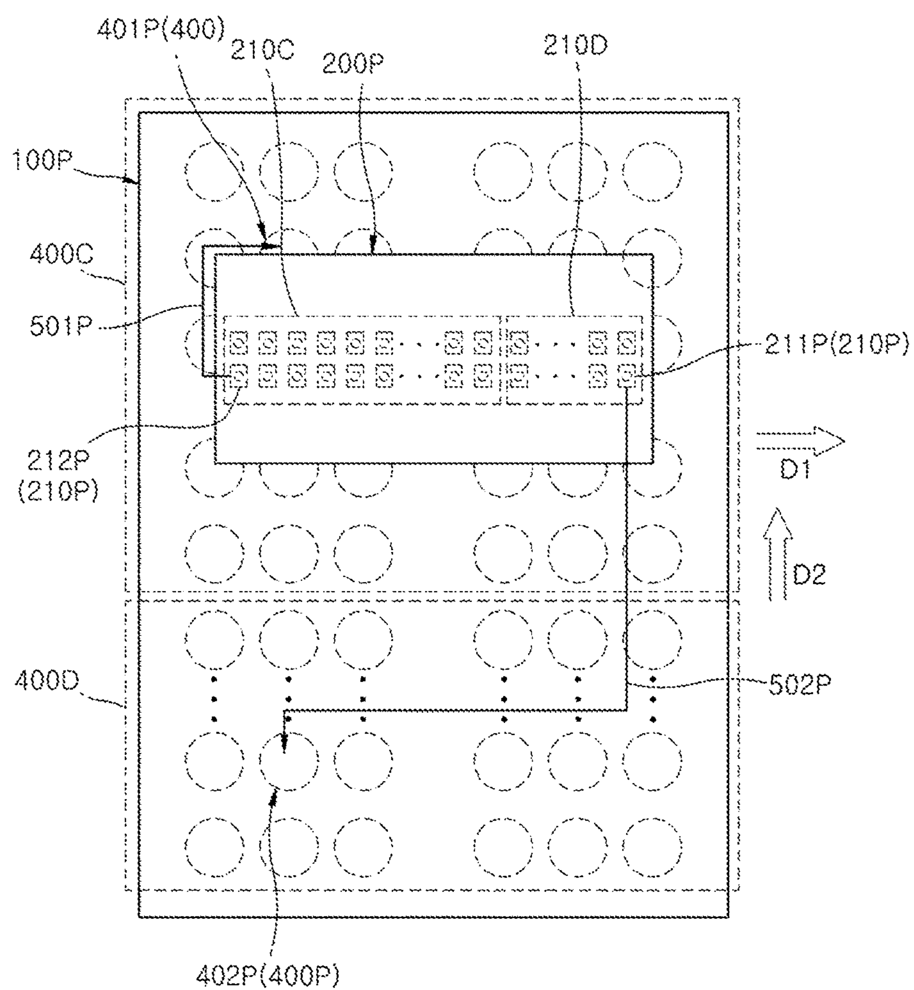

FIGS. 10 and 11 are plan views illustrating semiconductor dice 200 and 200P disposed on the package substrate 100. FIG. 10 illustrates an example in which the direction D1 along which the die pads 210 of the semiconductor die 200 are arrayed is parallel with the direction D2 along which the outer connectors 400 are arrayed, and FIG. 11 illustrates an example in which the direction D1 along which die pads 210P of the semiconductor die 200P are arrayed is perpendicular to the direction D2 along which the outer connectors 400 are arrayed.

As illustrated in FIG. 10, if the semiconductor die 200 is disposed on the package substrate 100 so that the direction D1 along which the die pads 210 are arrayed is parallel with the direction D2 along which the outer connectors 400 are arrayed, lengths of signal paths 501 and 502 may be reduced. For example, a first die pad 211 of the die pads 210 in the command/address pad region 210C may be located adjacent to a first outer connector 401 of the outer connectors 400 in the command/address ball region 400C, and the first die pad 211 may be electrically connected to the first outer connector 401 through the command/address signal path 501. Thus, a length of the command/address signal path 501 may be relatively reduced. In addition, a second die pad 212 of the die pads 210 in the data pad region 210D may be located adjacent to a second outer connector 402 of the outer connectors 400 in the data ball region 400D, and the second die pad 212 may be electrically connected to the second outer connector 402 through the data signal path 502. Thus, a length of the data signal path 502 may be relatively reduced.

As illustrated in FIG. 11, in the event that the semiconductor die 200P is disposed on the package substrate 100 so that the direction D1 is perpendicular to the direction D2, a third die pad 211P in the data pad region 210D may be located relatively far from a third outer connector 402P of the outer connectors 400 in the data ball region 400D, and the third die pad 211P may be electrically connected to the third outer connector 402P through a data signal path 502P. Thus, a length of the data signal path 502P may increase as compared to the data signal path 502 described with reference to FIG. 10. In addition, a fourth die pad 212P in the command/address pad region 210C may be located far from a fourth outer connector 401P of the outer connectors 400 in the command/address ball region 400C, and the fourth die pad 212P may be electrically connected to the fourth outer connector 401P through a command/address signal path 501P. Thus, a length of the command/address signal path 501P may increase as compared to the command/address signal path 501 described with reference to FIG. 10.

As described with reference to FIGS. 10 and 11, lengths of the signal paths 501, 501P, 502 and 502P disposed in the package substrate 100 may vary according to the disposition of the semiconductor die 200 or 200P. That is, if the semiconductor dice 200 are disposed on the package substrate 100 so that the direction D1 along which the die pads 210 are arrayed is the same as direction D2 along which the outer connectors 400 are arrayed, the length of the signal paths may be efficiently reduced. Accordingly, a parasitic capacitance value Cpackagesubstrate due to the package substrate 100 may be reduced to decrease a total parasitic capacitance value of the P-DDP 11. Moreover, since the lengths of the signal paths are reduced, an inductance value of the signal paths may also be reduced to improve the signal integrity characteristic of the P-DDP 11.

FIGS. 12 to 18 illustrate trace patterns of a planar dual die package according to an embodiment.

Figure 12:
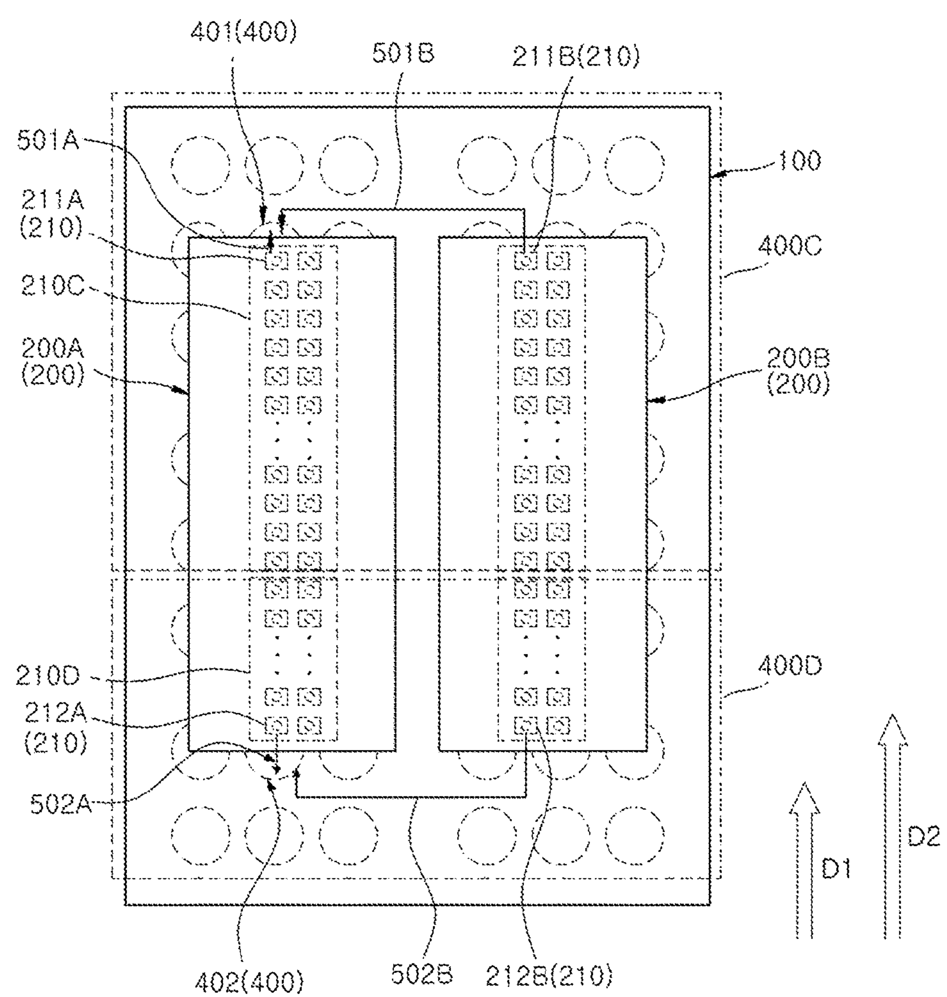
FIGS. 12 to 18 illustrate trace patterns of a planar dual die package according to an embodiment.

As illustrated in FIG. 12, the first semiconductor die 200A and the second semiconductor die 200B may be disposed side by side on the package substrate 100 so that the direction D1 along which the die pads 210 are arrayed is parallel with the direction D2 along which the outer connectors 400 are arrayed. A first die pad 211A of the first semiconductor die 200A corresponding to a left semiconductor die may be electrically connected to a first outer connector 401 of the outer connectors 400 through a first signal path 501A, and a first die pad 211B of the second semiconductor die 200B corresponding to a right semiconductor die of the semiconductor dice 200 may be electrically connected to the first outer connector 401 of the outer connectors 400 through a second signal path 501B. Further, a second die pad 212A of the first semiconductor die 200A may be electrically connected to the second outer connector 402 through a third signal path 502A, and a second die pad 212B of the second semiconductor die 200B may be electrically connected to the second outer connector 402 through a fourth signal path 502B. In one example, a portion of the first signal path 501A and a portion of the second signal path 501B may be a same portion. These signal paths 501A and 501B may be realized using conductive trace patterns disposed in the package substrate 100. That is, the die pads 210 of each semiconductor die 200A or 200B may be electrically connected to the outer connectors 400 through the conductive trace patterns disposed in the package substrate 100. The conductive trace patterns may be realized to have a multi-layered structure so that the die pads 210 of each semiconductor die 200A or 200B are electrically insulated from each other.

The first and second semiconductor dice 200A and 200B may be disposed on the package substrate 100 so that the data pad regions 210D overlap with portions of the data ball region 400D and the command/address pad regions 210C overlap with portions of the command/address ball region 400C. Some portions of the data ball region 400D and some portions of the command/address ball region 400C may possibly not overlap with any of the first and second semiconductor dice 200A and 200B and may be located to surround the first and second semiconductor dice 200A and 200B in a plan view.

Figure 13:
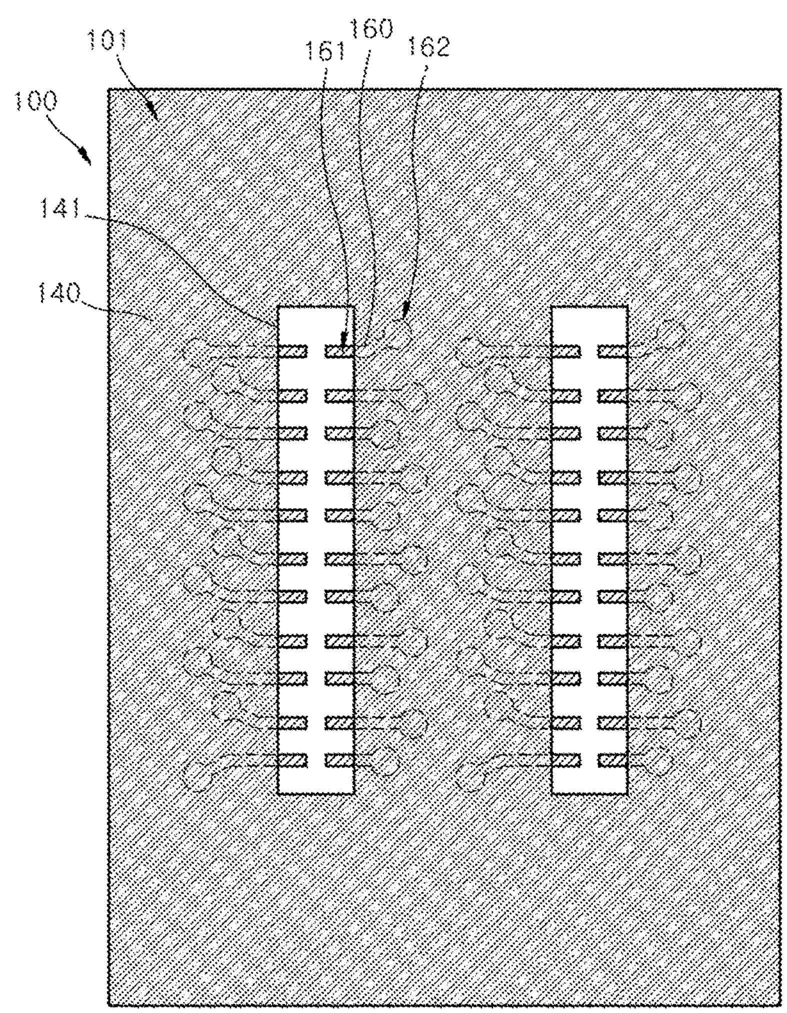

FIG. 13 is a top plan view illustrating the first surface 101 of the package substrate 100. The first surface 101 of the package substrate 100 may correspond to a surface on which the semiconductor dice (200 of FIG. 12) are disposed. The first surface 101 of the package substrate 100 may correspond to a surface of a first resist layer 140. The first resist layer 140 may include a solder resist material. The first resist layer 140 may cover and protect first trace patterns 160. The first trace patterns 160 may include conductive lines connected to the semiconductor dice 200. The first resist layer 140 may have a pair of first windows 141 that expose first landing portions 161 of the first trace patterns 160. Each of the first windows 141 may have a bar shape. The first landing portions 161 of the first trace patterns 160 may overlap with the die pads (210 of FIG. 12) of the semiconductor dice (200 of FIG. 12), respectively. Since the two semiconductor dice 200 are mounted side by side on the package substrate 100, the pair of first windows 141 may also be disposed side by side. Each of the first windows 141 may expose the first landing portions 161 which are connected to any one of the semiconductor dice 200. The first trace patterns 160 disposed in a left portion of the package substrate 100 may be disposed to have the same array configuration as the first trace patterns 160 disposed in a right portion of the package substrate 100.

Figure 14:
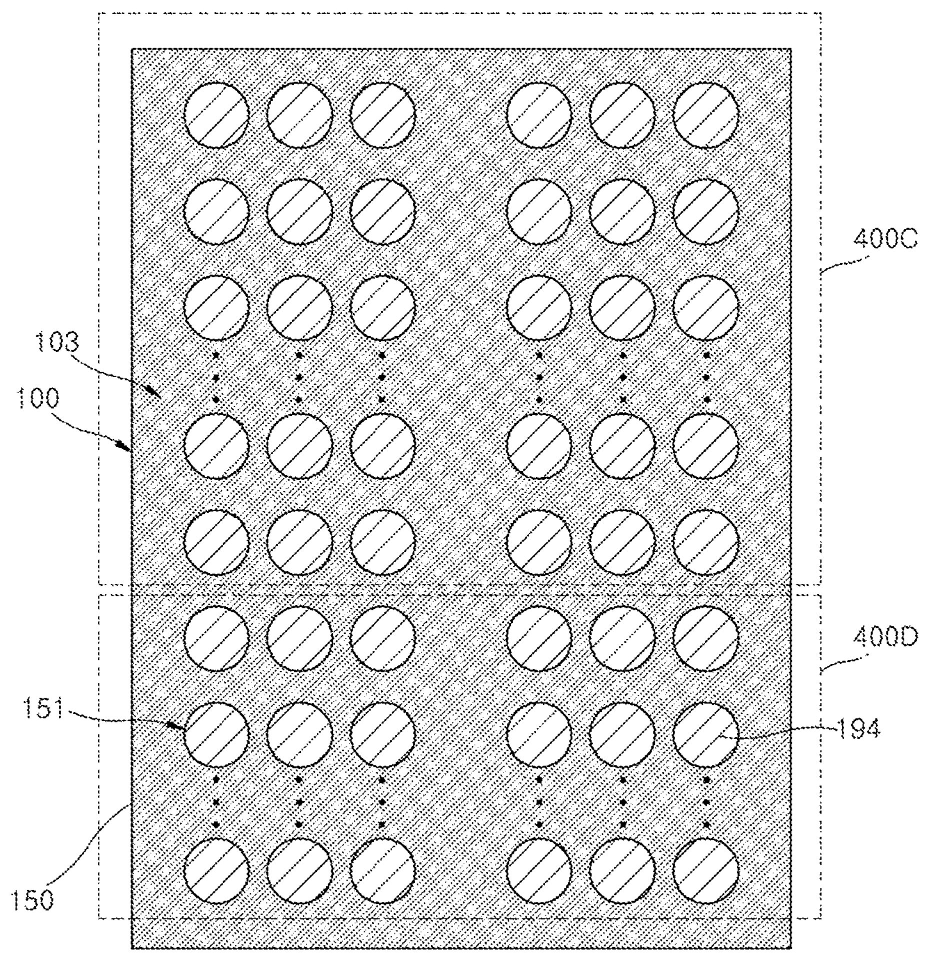

FIG. 14 is a bottom plan view illustrating the second surface 103 of the package substrate 100. The second surface 103 of the package substrate 100 may correspond to a surface to which the outer connectors (400 of FIG. 3) are attached. The second surface 103 of the package substrate 100 may correspond to a surface of a second resist layer 150. The second resist layer 150 may include a solder resist material. The second resist layer 150 may have a plurality of second windows 151 that expose second landing portions 194 of fourth trace patterns of the package substrate 100. The second landing portions 194 may be disposed at substantially the same positions as the outer connectors 400 shown in FIG. 7 in a plan view.

Figure 15:
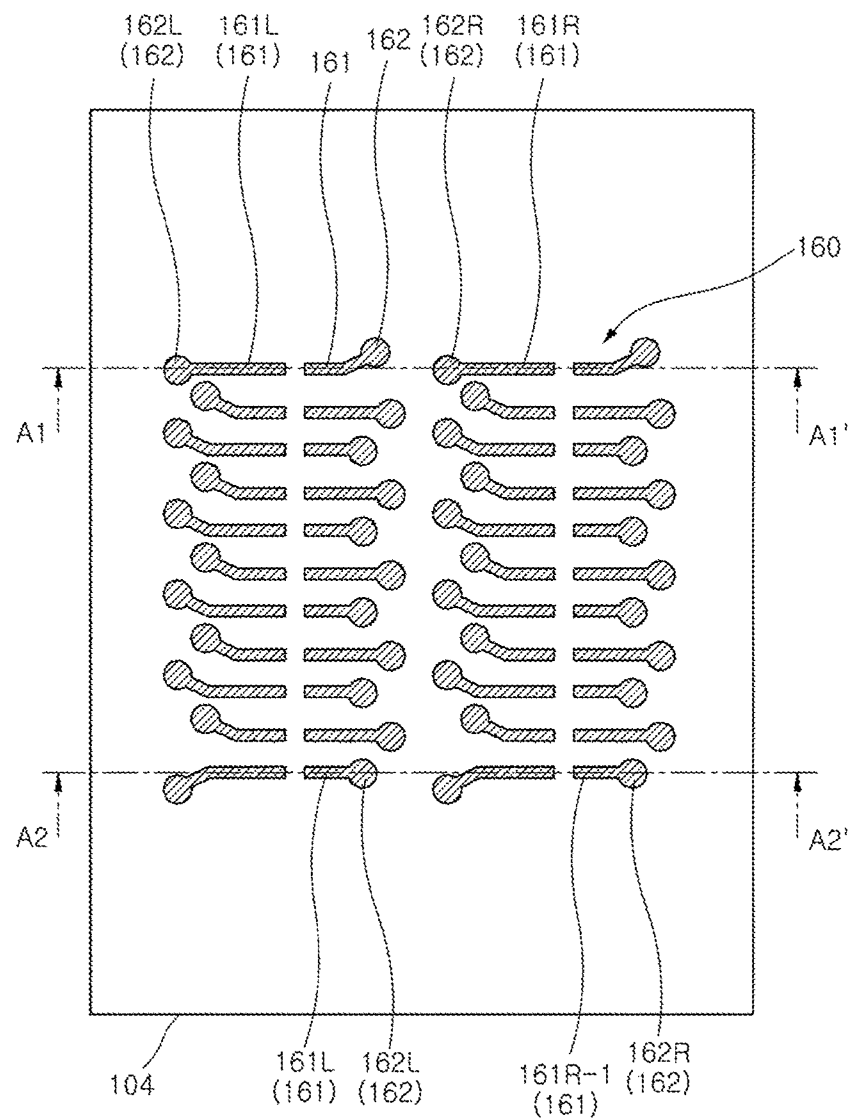
Figure 16:
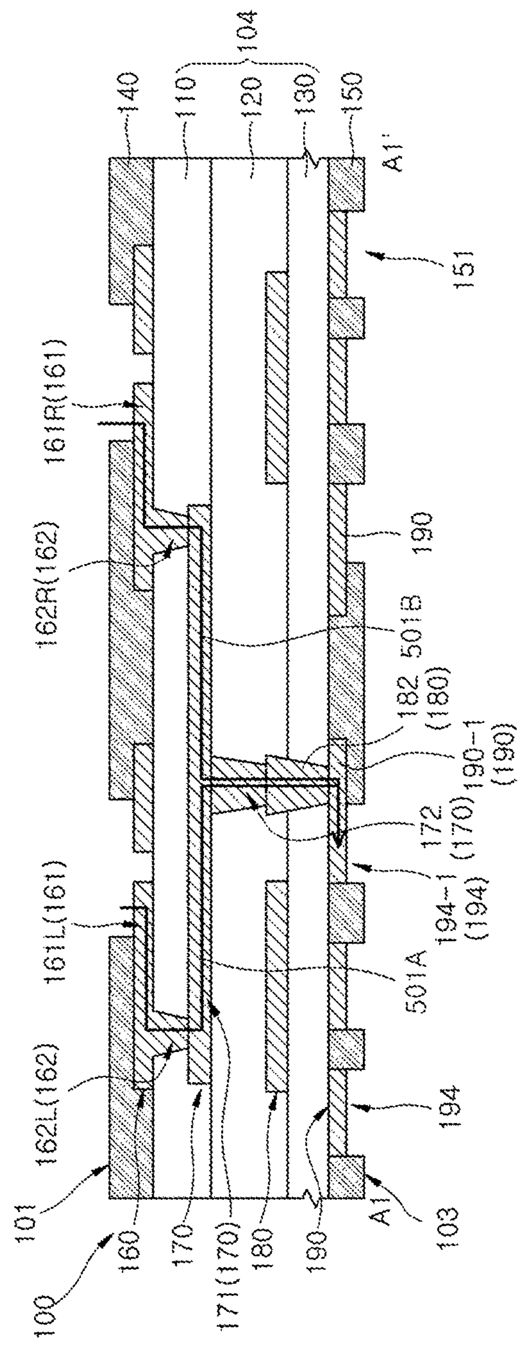
Figure 17:
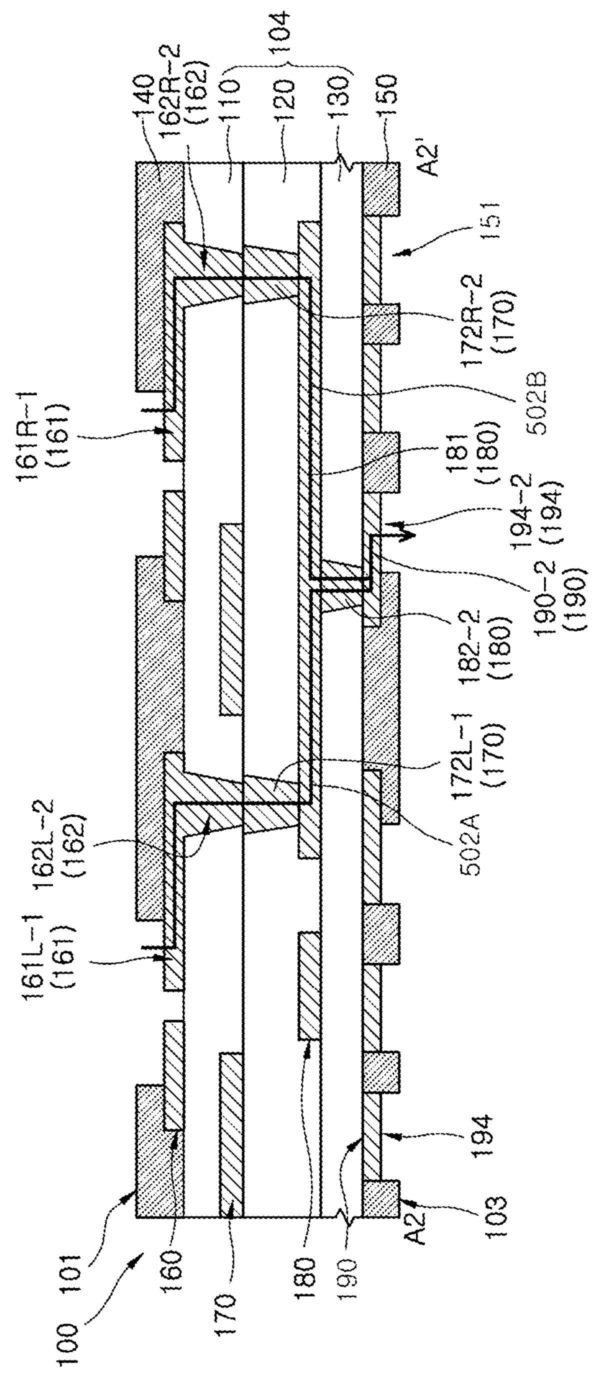

FIG. 15 is a plan view illustrating the first trace patterns 160 disposed on a core layer 104 of the package substrate 100. FIG. 16 is a cross-sectional view taken along a line A1-A1' of FIG. 15, and FIG. 17 is a cross-sectional view taken along a line A2-A2' of FIG. 15.

In FIG. 15, the first resist layer 140 of the package substrate 100 is omitted to clearly show the first trace patterns 160. The first trace patterns 160 may be disposed on a core layer 104 of the package substrate 100. Referring to FIGS. 12, 15, 16, and 17 the first trace patterns 160 may be disposed on the core layer 104 so that the first landing portions 161 of the first trace patterns 160 overlap with the semiconductor dice 200A and 200B in a plan view. As illustrated in FIG. 12, the first die pad 211A of the first semiconductor die 200A and the first die pad 211B of the second semiconductor die 200B may be electrically connected to the first outer connector 401 in common through the first and second signal paths 501A and 501B, respectively. The first, second, third and fourth signal paths 501A, 501B, 502A, and 502B may be realized using conductive trace patterns having a multi-layered structure disposed in the package substrate 100.

As illustrated in FIG. 16, the package substrate 100 may include the first resist layer 140, the second resist layer 150, and the core layer 104 disposed between the first and second resist layers 140 and 150. The core layer 104 may correspond to a body of the package substrate 100. The core layer 104 may be comprised of a dielectric layer. In the event that the first trace patterns 160 are realized having a multi-layered structure, the core layer 104 may also be comprised of a plurality of dielectric layers constituting a multi-layered structure. In some embodiments, the core layer 104 may include a first core layer 110 contacting a bottom surface of the first resist layer 140, a second core layer 120 contacting a bottom surface of the first core layer 110 opposite to the first resist layer 140, and a third core layer 130 contacting a bottom surface of the second core layer 120 opposite to the first core layer 110. In such a case, the second resist layer 150 may contact a bottom surface of the third core layer 130 opposite to the second core layer 120.

The first trace patterns 160 may be disposed on a top surface of the first core layer 110 and may be covered and protected by the first resist layer 140. Second trace patterns 170 may be disposed between the first and second core layers 110 and 120, and third trace patterns 180 may be disposed between the second and third core layers 120 and 130. In addition, fourth trace patterns 190 may be disposed on the bottom surface of the third core layer 130, and the second landing portions 194 of the fourth trace patterns 190 may be exposed by the second windows 151 of the second resist layer 150.

Portions of the first trace patterns 160 may be electrically connected to portions of the second trace patterns 170 through first conductive vias 162 vertically penetrating the first core layer 110. Portions of the second trace patterns 170 may be electrically connected to portions of the third trace patterns 180 through second conductive vias 172 vertically penetrating the second core layer 120. Portions of the third trace patterns 180 may be electrically connected to portions of the fourth trace patterns 190 through third conductive vias 182 vertically penetrating the third core layer 130. The conductive vias 162, 172 and 182 may correspond to extensions of the trace patterns 160, 170 and 180 which are located at two or more different levels.

The first signal path 501A extending from the first die pad 211A of the first semiconductor die 200A illustrated in FIG. 12 may be comprised of a first landing portion 161L of a left one of the first trace patterns 160, a first conductive via 162L connected to the first landing portion 161L, a second trace pattern 171 connected to the first conductive via 162L, the second conductive via 172 connected to the second trace pattern 171, the third conductive via 182 connected to the second conductive via 172, and a fourth trace pattern 190-1 coupled between the third conductive via 182 and a second landing portion 194-1.

The second signal path 5016 extending from the first die pad 2116 of the second semiconductor die 2006 illustrated in FIG. 12 may be comprised of a first landing portion 161R of a right one of the first trace patterns 160, a first conductive via 162R connected to the first landing portion 161R, the second trace pattern 171 connected to the first conductive via 162R, the second conductive via 172 connected to the second trace pattern 171, the third conductive via 182 connected to the second conductive via 172, and the fourth trace pattern 190-1 coupled between the third conductive via 182 and the second landing portion 194-1. The first signal path 501A may share the second trace pattern 171, the second conductive via 172, the third conductive via 182, and the fourth trace pattern 190-1 with the second signal path 501B.

As illustrated in FIG. 17, a third signal path 502A distinct from the first signal path 501A shown in FIG. 16 may be comprised of a first landing portion 161L-1 of a left one of the first trace patterns 160, a first conductive via 162L-2 connected to the first landing portion 161L-1, a second conductive via 172L-1 connected to the first conductive via 162L-2, a third trace pattern 181 connected to the second conductive via 172L-1, a third conductive via 182-2 connected to the third trace pattern 181, and a fourth trace pattern 190-2 coupled between the third conductive via 182-2 and a second landing portion 194-2. In addition, a fourth signal path 502B distinct from the second signal path 501B shown in FIG. 16 may be comprised of a first landing portion 161R-1 of a right one of the first trace patterns 160, a first conductive via 162R-2 connected to the first landing portion 161R-1, a second conductive via 172R-2 connected to the first conductive via 162R-2, the third trace pattern 181 connected to the second conductive via 172R-2, the third conductive via 182-2 connected to the third trace pattern 181, and the fourth trace pattern 190-2 coupled between the third conductive via 182-2 and the second landing portion 194-2. The third signal path 502A may share the third trace pattern 181, the third conductive via 182-2 and the fourth trace pattern 190-2 with the fourth signal path 502B. As illustrated in FIGS. 16 and 17, the first and second signal paths 501A and 501B may be realized in the package substrate 100 to have a different trace structure from the third and fourth signal paths 502A and 502B.

Figure 18:
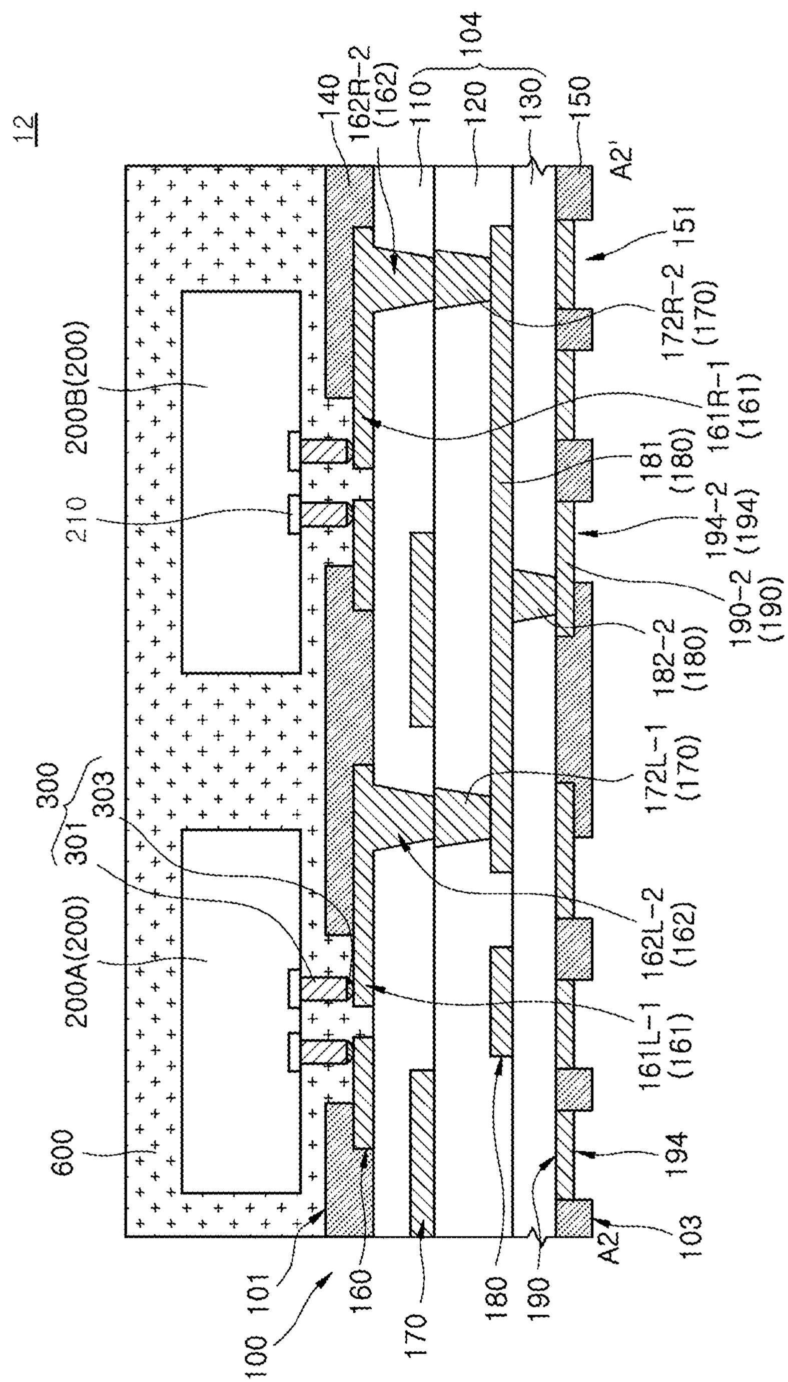

As illustrated in FIG. 18, the first and second semiconductor dice 200A and 200B may be mounted side by side on the package substrate 100 including the first and second signal paths 501A and 501B of FIG. 16 as well as the third and fourth signal paths 502A and 502B of FIG. 17 to provide a semiconductor package 12. The first semiconductor die 200A may be electrically connected to the second landing portion 194-2 through the third signal path (502A of FIG. 17), and the second semiconductor die 200B may also be electrically connected to the second landing portion 194-2 through the fourth signal path (502B of FIG. 17).

Figure 19:
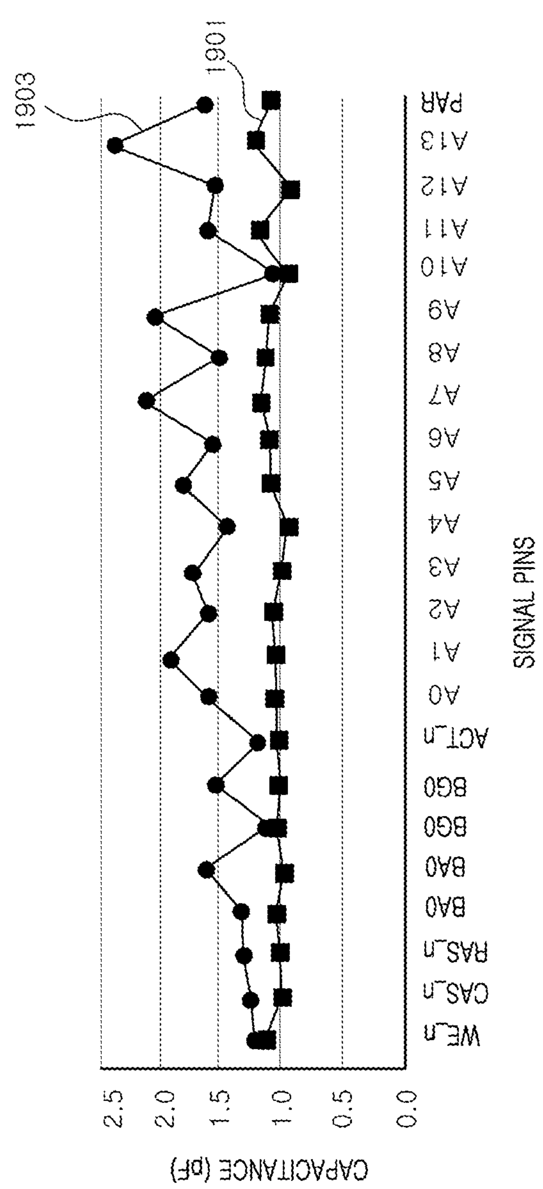
FIG. 19 is a graph illustrating a simulation result of capacitance values of various signal pins included in a semiconductor package according to an embodiment.

FIG. 19 is a graph illustrating a simulation result of capacitance values of various signal pins included in a semiconductor package according to an embodiment. In the graph of FIG. 19, the abscissa (i.e., the X-axis) denotes various signal pins, and the ordinate (i.e., the Y-axis) denotes a capacitance value at each of the signal pins. In the graph of FIG. 19, the data indicated by the numeral "1901" corresponds to parasitic capacitance values of the various signal pins when the semiconductor die 200 is mounted on the package substrate 100 so that the array direction D1 of the die pads 210 is parallel with the array direction D2 of the outer connectors 400 corresponding to the signal pins (see FIG. 10), and the data indicated by the numeral "1903" corresponds to parasitic capacitance values of the various signal pins when the semiconductor die 200P is mounted on the package substrate 100P so that the array direction D1 of the die pads 210P is perpendicular to the array direction D2 of the outer connectors 400P corresponding to the signal pins (see FIG. 11). As can be seen from the data of FIG. 19, the parasitic capacitance values of the various signal pins (i.e., the outer connectors 400) of the semiconductor package including the semiconductor die 200 having the die pads 210 arrayed in the same direction as the outer connectors 400 were lower than the parasitic capacitance values of the various signal pins (i.e., the outer connectors 400P) of the semiconductor package including the semiconductor die 200P having the die pads 210P arrayed in a direction perpendicular to the array direction of the outer connectors 400P.

Figure 20:
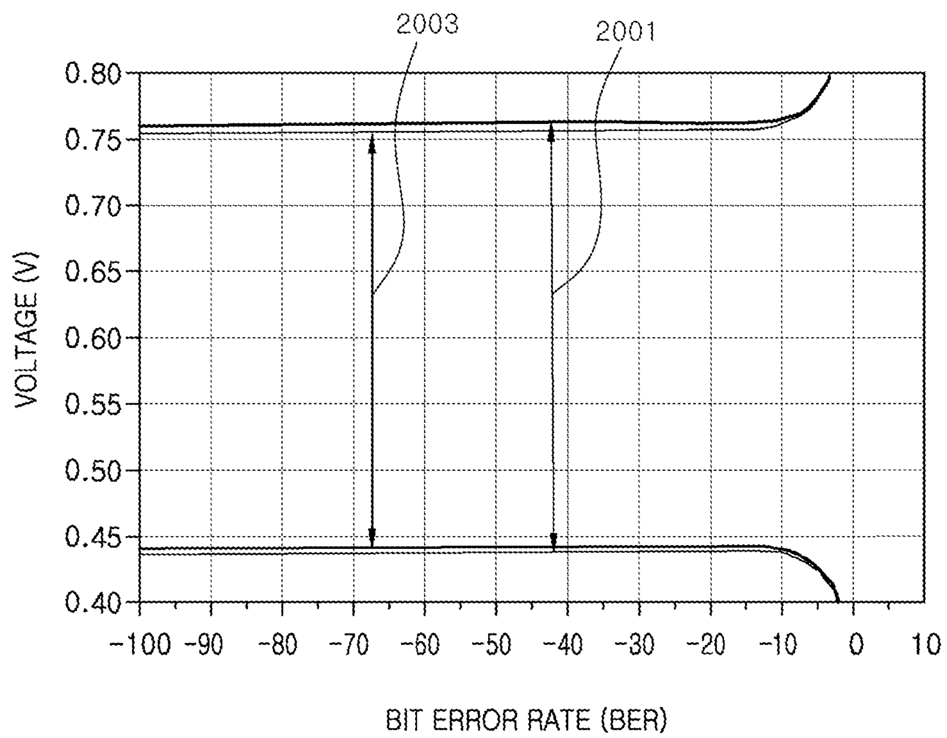
FIGS. 20 and 21 are graphs illustrating simulation results of signal integrities of semiconductor packages according to some embodiments.
Figure 21:
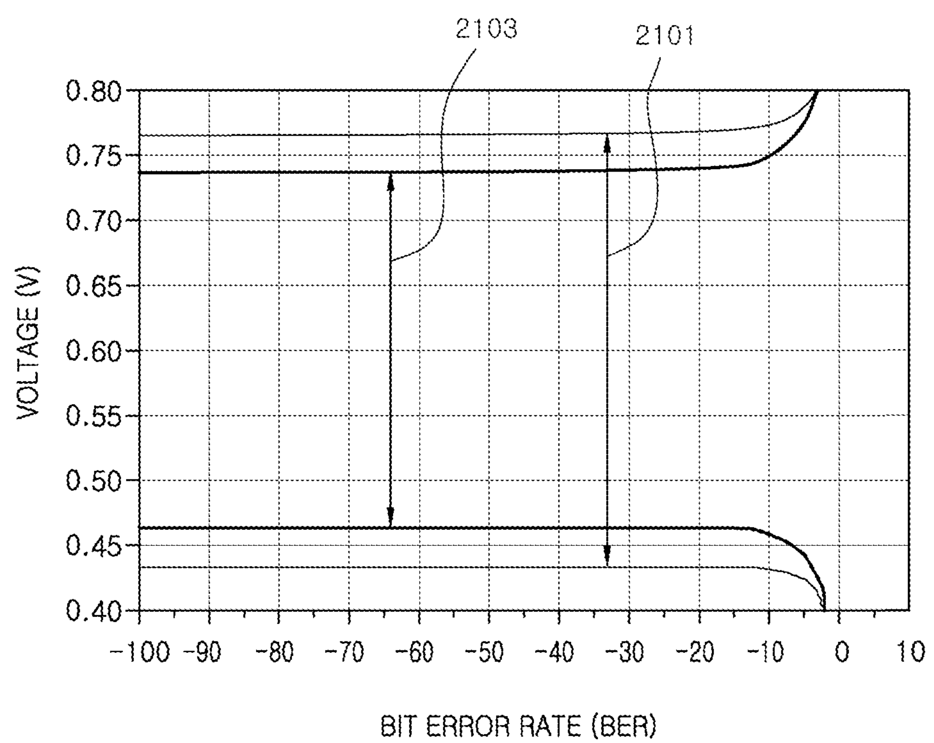

FIGS. 20 and 21 are graphs illustrating simulation results of signal integrity of semiconductor packages according to some embodiments. FIG. 20 illustrates the signal integrity margin of the semiconductor packages operating at a data transmission speed of 2,933 Mega-bits per second (Mbps), and FIG. 21 illustrates the signal integrity margin of semiconductor packages operating at a data transmission speed of 3,200 Mega-bits per second (Mbps). In the graphs of FIGS. 20 and 21, the abscissas (i.e., the X-axis) denote bit error rate (BER) and the ordinates (i.e., the Y-axis) denote a voltage value of signals, that is, a signal eye open voltage value. In FIGS. 20 and 21, the signal eye open voltage denotes a voltage swing width of signals of the semiconductor packages when a voltage of 0.6 volts is regarded as a reference voltage. If the signal eye open voltage increases, it can be understood that the signal integrity of the semiconductor packages is improved.

In FIGS. 20 and 21, the data indicated by the numerals "2001" and "2101" correspond to the signal eye open voltages when the semiconductor die 200 is mounted on the package substrate 100 so that the array direction D1 of the die pads 210 is parallel with the array direction D2 of the outer connectors 400 corresponding to the signal pins (see FIG. 10). The data indicated by the numerals "2003" and "2103" correspond to the signal eye open voltages when the semiconductor die 200P is mounted on the package substrate 100P so that the array direction D1 of the die pads 210P is perpendicular to the array direction D2 of the outer connectors 400P corresponding to the signal pins (see FIG. 11).

As can be seen from the data of FIG. 20, when the semiconductor dice 200 and 200P operate at a data transmission speed of 2,933 Mbps, the signal eye open voltage 2001 of the semiconductor package including the semiconductor die 200 having the die pads 210 arrayed in the same direction as the outer connectors 400 was about 10 mV greater than the signal eye open voltage 2003 of the semiconductor package including the semiconductor die 200P having the die pads 210P arrayed in a direction perpendicular to the array direction of the outer connectors 400P. Specifically, the signal eye open voltage 2001 was about 322 mV, and the signal eye open voltage 2003 was about 312 mV. Thus, it can be understood that the signal integrity of the semiconductor package shown in FIG. 10 is improved by about 10 mV as compared with the semiconductor package shown in FIG. 11. In addition, as can be seen from the data of FIG. 21, when the semiconductor dice 200 and 200P operate at a data transmission speed of 3,200 Mbps, the signal eye open voltage 2101 of the semiconductor package including the semiconductor die 200 having the die pads 210 arrayed in the same direction as the outer connectors 400 was about 60 mV greater than the signal eye open voltage 2103 of the semiconductor package including the semiconductor die 200P having the die pads 210P arrayed in a direction perpendicular to the array direction of the outer connectors 400P. Specifically, the signal eye open voltage 2101 was about 324 mV, and the signal eye open voltage 2103 was about 264 mV. Thus, it can be understood that the signal integrity of the semiconductor package shown in FIG. 10 is improved by about 60 mV as compared with the semiconductor package shown in FIG. 11.

As can be seen from the above simulation results shown in FIGS. 20 and 21, if the data transmission speed of the semiconductor packages increases, the signal integrity margin of the semiconductor packages according to the embodiments may be improved greatly.

Figure 22:
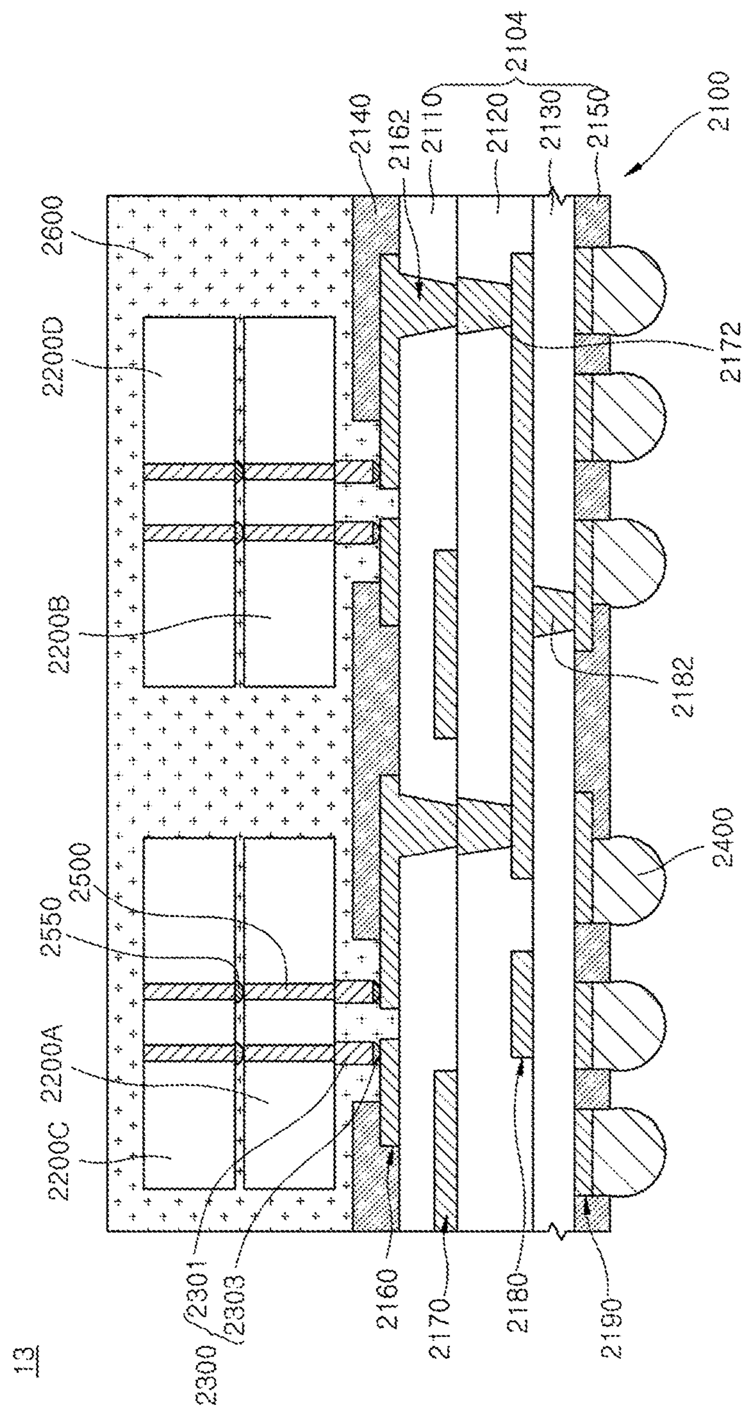
FIG. 22 is a cross-sectional view illustrating a semiconductor package according to another embodiment.

FIG. 22 is a cross-sectional view illustrating a semiconductor package 13 according to another embodiment. The semiconductor package 13 may include first to fourth semiconductor dice 2200A, 2200B, 2200C and 2200D which are mounted on a package substrate 2100. The first and second semiconductor dice 2200A and 2200B may be mounted side by side on the package substrate 2100. The third and fourth semiconductor dice 2200C and 2200D may be stacked on the first and second semiconductor dice 2200A and 2200B, respectively. The first and third semiconductor dice 2200A and 2200C may be electrically connected to each other by interconnection structures including through electrodes 2500 such as through silicon vias (TSVs) and inter-die connectors 2550 such as bumps. Similarly, the second and fourth semiconductor dice 2200B and 2200D may be electrically connected to each other by interconnection structures including the through electrodes 2500 such as through silicon vias (TSVs) and the inter-die connectors 2550 such as bumps. The semiconductor package 13 may have a P-DDP structure shown in FIG. 2 and may further include a stack structure with TSVs. That is, the semiconductor package 13 may have a planar stack multi-die package structure. The semiconductor package 13 may have relatively short signal paths including the TSVs. Since the semiconductor package 13 includes TSVs, the semiconductor package 13 may have a packing density which is at least twice that of the semiconductor package 11 shown in FIGS. 2 and 3.

The first and second semiconductor dice 2200A and 2200B may be connected to the package substrate 2100 through inner connectors 2300. Each of the inner connectors 2300 may include a conductive post 2301 and a solder layer 2303. The package substrate 2100 may include a core layer 2104 having a multi-layered structure and trace patterns having a multi-layered structure. The core layer 2104 may include a first core layer 2110, a second core layer 2120, and a third core layer 2130 which are stacked. A first resist layer 2140 may be disposed on a surface of the first core layer 2110 opposite to the second core layer 2120, and a second resist layer 2150 may be disposed on a surface of the third core layer 2130 opposite to the second core layer 2120. First trace patterns 2160 may be disposed on the first core layer 2110 and may be covered and protected by the first resist layer 2140. Second trace patterns 2170 may be disposed between the first and second core layers 2110 and 2120, and third trace patterns 2180 may be disposed between the second and third core layers 2120 and 2130. Fourth trace patterns 2190 may be disposed between the third core layer 2130 and the second resist layer 2150. Outer connectors 2400 such as solder balls may be attached to the fourth trace patterns 2190, respectively. Portions of the first trace patterns 2160 may be electrically connected to portions of the second trace patterns 2170 through first conductive vias 2162 vertically penetrating the first core layer 2110. Portions of the second trace patterns 2170 may be electrically connected to portions of the third trace patterns 2180 through second conductive vias 2172 vertically penetrating the second core layer 2120. Portions of the third trace patterns 2180 may be electrically connected to portions of the fourth trace patterns 2190 through third conductive vias 2182 vertically penetrating the third core layer 2130. Each of the first and second semiconductor dice 2100A and 2100B may have the same configuration as the semiconductor die 200 described with reference to FIGS. 3 to 18, and the package substrate 2100 may also have the same configuration as the package substrate 100 described with reference to FIGS. 3 to 18.

Figure 23:
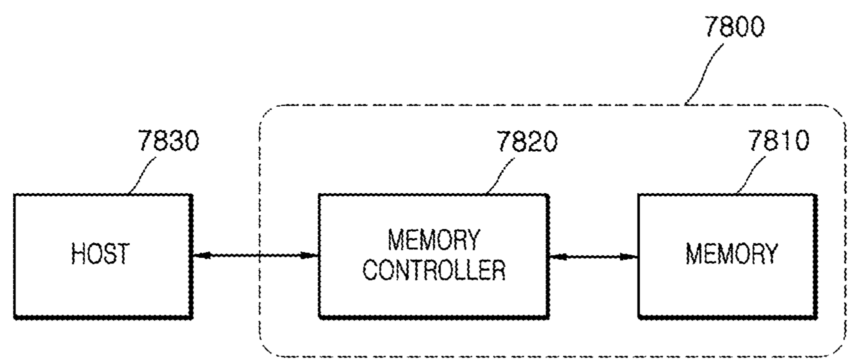
FIG. 23 is a block diagram illustrating an electronic system employing a memory card including a package according to an embodiment.

FIG. 23 is a block diagram illustrating an electronic system employing a memory card 7800 including at least one semiconductor package according to an embodiment of the present disclosure. The memory card 7800 may include a memory 7810 such as a nonvolatile memory device and a memory controller 7820. The memory 7810 and the memory controller 7820 may store data or may read stored data. The memory 7810 and/or the memory controller 7820 include one or more semiconductor chips disposed in an embedded package according to an embodiment.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 24:
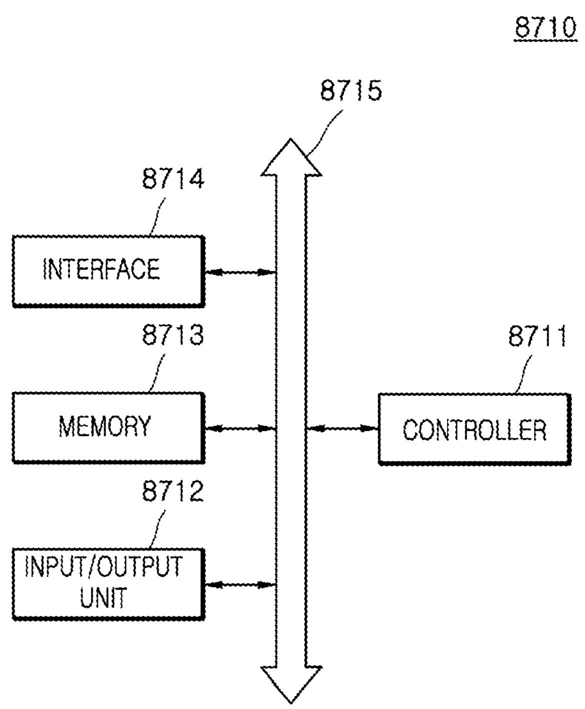
FIG. 24 is a block diagram illustrating another electronic system including a package according to an embodiment.

FIG. 24 is a block diagram illustrating an electronic system 8710 including at least one package according to an embodiment. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessors, digital signal processors, microcontrollers, and/or logic devices capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 is equipment capable of performing wireless communications, the electronic system 8710 may be used in a communication system such as CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:

a package substrate having a first surface and a second surface which are opposite to each other;

a first semiconductor die and a second semiconductor die disposed on the first surface of the package substrate;

a third semiconductor die stacked on the first semiconductor die;

a fourth semiconductor die stacked on the second semiconductor die;

first through electrodes and first inter-die connectors electrically connecting the first semiconductor die to the third semiconductor die; and second through electrodes and second inter-die connectors electrically connecting the second semiconductor die to the fourth semiconductor die, wherein the package substrate further includes an outer connector, a first signal path and a second signal path, wherein the first signal path electrically connects a first die pad of the first semiconductor die to the outer connector, wherein the second signal path electrically connects a second die pad of the second semiconductor die to the same outer connector, wherein the first die pad and the second die pad are the same kind of signal pins, and wherein the first and second semiconductor dies have same function.

2. The semiconductor package of claim 1, wherein each of the first and second semiconductor dies has a command/address pad region and a data pad region having die pads, wherein the package substrate includes a command/address ball region and a data ball region on the second surface, and wherein the command/address pad regions of the first and second semiconductor dies and the data pad regions of the first and second semiconductor dies overlap the command/address ball region and the data ball region, respectively.

3. The semiconductor package of claim 2, wherein the command/address ball region and the data ball region are defined as two distinct regions of the second surface of the package substrate.

4. The semiconductor package of claim 2, wherein the first and second semiconductor dies are disposed on the package substrate so that the data pad regions of the first and second semiconductor dice overlap with portions of the data ball region and the command/address pad regions of the first and second semiconductor dice overlap with portions of the command/address ball region.

5. The semiconductor package of claim 2, wherein the first and second semiconductor dies are disposed on the package substrate so that the die pads face the first surface of the package substrate.

6. The semiconductor package of claim 1, wherein the first to forth semiconductor dies have the same configuration and function.

7. The semiconductor package of claim 1, wherein the outer connectors are solder balls.

8. The semiconductor package of claim 1, further comprising inner connectors that electrically connect the first surface of the package substrate to the die pads of the first and second semiconductor dice.

9. The semiconductor package of claim 1, wherein the first and second signal paths are comprised of trace patterns having a multi-layered structure.

10. A semiconductor package comprising:

a package substrate having a first surface and a second surface which are opposite to each other;

a first semiconductor die and a second semiconductor die disposed on the first surface of the package substrate;

a third semiconductor die stacked on the first semiconductor die;

a fourth semiconductor die stacked on the second semiconductor die;

first through electrodes and first inter-die connectors electrically connecting the first semiconductor die to the third semiconductor die;

second through electrodes and second inter-die connectors electrically connecting the second semiconductor die to the fourth semiconductor die; and outer connectors disposed on the second surface of the package substrate, wherein the first semiconductor die includes a first die pad and second semiconductor die includes a second die pad, and wherein the package substrate includes signal paths that electrically connect the first die pad and the second die pad to one of the outer connectors, wherein the first die pad and the second die pad are the same kind of signal pins, and wherein the first and second semiconductor dies have same function.

11. The semiconductor package of claim 10, wherein each of the first and second semiconductor dies has a command/address pad region and a data pad region having die pads, wherein the package substrate includes a command/address ball region and a data ball region on the second surface, and wherein the command/address pad regions of the first and second semiconductor dies and the data pad regions of the first and second semiconductor dies overlap the command/address ball region and the data ball region, respectively.

12. The semiconductor package of claim 11, wherein the command/address ball region and the data ball region are defined as two distinct regions of the second surface of the package substrate.

13. The semiconductor package of claim 11, wherein the first and second semiconductor dies are disposed on the package substrate so that the data pad regions of the first and second semiconductor dice overlap with portions of the data ball region and the command/address pad regions of the first and second semiconductor dice overlap with portions of the command/address ball region.

14. The semiconductor package of claim 11, wherein the first and second semiconductor dies are disposed on the package substrate so that the die pads face the first surface of the package substrate.

15. The semiconductor package of claim 11, wherein the first to forth semiconductor dies have the same configuration and function.

16. The semiconductor package of claim 10, wherein the outer connectors are solder balls.

17. The semiconductor package of claim 10, further comprising inner connectors that electrically connect the first surface of the package substrate to the die pads of the first and second semiconductor dies.

18. The semiconductor package of claim 10, wherein the signal paths are comprised of trace patterns having a multi-layered structure.

* * * * *